United States Patent
Lai et al.

(10) Patent No.: US 10,636,812 B1
(45) Date of Patent: Apr. 28, 2020

(54) REDUCING WORD LINE CAPACITANCE IN 3D MEMORY

(71) Applicant: MACRONIX INTERNATIONAL CO., LTD., Hsinchu (TW)

(72) Inventors: Erh-Kun Lai, Tarrytown, NY (US); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/276,263

(22) Filed: Feb. 14, 2019

(51) Int. Cl.
*G11C 11/34* (2006.01)
*H01L 27/11582* (2017.01)
*H01L 27/1157* (2017.01)
*G11C 16/24* (2006.01)
*G11C 16/08* (2006.01)
*G11C 16/04* (2006.01)

(52) U.S. Cl.
CPC .... *H01L 27/11582* (2013.01); *G11C 16/0466* (2013.01); *G11C 16/08* (2013.01); *G11C 16/24* (2013.01); *H01L 27/1157* (2013.01)

(58) Field of Classification Search
CPC .......... H01L 27/11582; H01L 27/1157; G11C 16/0466; G11C 16/08; G11C 16/24
USPC .................................................. 365/185.11
See application file for complete search history.

(56) References Cited

U.S. PATENT DOCUMENTS

| | | | |
|---|---|---|---|
| 8,923,048 B2 * | 12/2014 | Rabkin | H01L 29/6675 365/185.05 |
| 9,373,632 B2 | 6/2016 | Chen | |
| 9,524,980 B2 | 12/2016 | Lue | |
| 2008/0087942 A1 | 4/2008 | Hsu et al. | |
| 2013/0307047 A1 | 11/2013 | Sakuma et al. | |
| 2015/0041879 A1 | 2/2015 | Jayanti et al. | |
| 2015/0069377 A1 | 3/2015 | Rabkin et al. | |
| 2016/0284722 A1 | 9/2016 | Lai | |

OTHER PUBLICATIONS

Erh-Kun Lai et al. "A Multi-Layer Stackable Thin-Film Transistor (TFT) NAND-Type Flash Memory," 2006 IEEE, pp. 1-4.
Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

(Continued)

*Primary Examiner* — Xiaochun L Chen
(74) *Attorney, Agent, or Firm* — Haynes Beffel & Wolfeld LLP

(57) ABSTRACT

A memory device, which can be configured as a 3D NAND flash memory, includes a plurality of stacks of conductive strips. The plurality of stacks of conductive strips includes a plurality of intermediate levels of conductive strips configured as word lines and an upper level of conductive strips configured as string select lines. A plurality of first patterned conductors is disposed above the plurality of stacks of conductive strips. A plurality of linking elements connects conductive strips in respective intermediate levels in the plurality of intermediate levels of conductive strips to first patterned conductors in the plurality of first patterned conductors. The linking elements in the plurality of linking elements include switches responsive to signals in conductive strips in the upper level of conductive strips.

20 Claims, 22 Drawing Sheets

(56) References Cited

OTHER PUBLICATIONS

Katsumata et al., "Pipe-shaped BiCS Flash Memory with 16 Stacked Layers and Multi-Level-Cell Operation for Ultra High Density Storage Devices", 2009 Sypmposium on VLSI technology Digest of Technical Papers, p. 136-137.

Lai et al., U.S. Appl. No. 15/950,021, "String Select Line Gate Oxide Method for 3D Vertical Channel NAND Memory," filed Apr. 10, 2018, 66 pages.

* cited by examiner

REDUCING WORD LINE CAPACITANCE IN 3D MEMORY

BACKGROUND

Field

The present invention relates to high density memory devices, and particularly to memory devices in which multiple levels of memory cells are arranged to provide a three-dimensional 3D memory device.

Description of Related Art

As critical dimensions of devices in integrated circuits shrink to the limits of common memory cell technologies, designers have been looking to techniques for stacking multiple levels of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006, incorporated by reference herein.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, incorporated by reference herein. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top.

In some 3D NAND flash memory technologies, vertical channel structures may be disposed in blocks arranged in rows. For each block, a plurality of horizontal word lines is formed by stacking planar word line layers that intersect with the vertical channel structures in the block, forming so-called gate-all-around memory cells at each layer. Each block also includes a string select line layer and a ground select line layer that intersect the vertical channels forming lower and upper select gates. Bit lines are coupled to the vertical channel structures across multiple blocks. Staircase contacts in 3D NAND flash memories with staircase structures can connect word lines to metal lines in a metal layer, which can, in turn, be connected to a word line decoder.

The stacked word lines have a large parasitic capacitance because of their planar structures. Increased capacitance can cause higher resistance-capacitance (RC) delays, lower operating speeds, higher read/write disturbance, and higher power consumption. Additionally, there is coupling capacitance between the word lines in neighboring blocks. Because of this coupling, program disturb sometimes occurs in a block during write and read operations in neighboring blocks.

It is desirable to provide a structure for 3D memory devices having less coupling capacitance between blocks of stacked word lines.

SUMMARY

A memory is described, which can be configured as a 3D NAND flash memory. The memory comprises a plurality of stacks of conductive strips. In each stack, an upper or top conductive strip is configured as the string select line, and the intermediate strips are configured as word lines. In some embodiments, a lower or bottom conductive strip can be configured as a ground select line. Each stack further comprises a plurality of vertical channel structures arranged orthogonally to the stack of conductive strips. Each of the vertical channel structures comprises a plurality of memory elements located at interface regions at cross-points between the word lines and the vertical channel structures. The vertical channel structures are coupled with bit line conductors in a layer above the upper level of conductive strips. The string select line in each stack intersects with a set of vertical channel structures in the stack to form string select gates. A signal in a particular string select line selects the set of vertical channel structures in the same stack as the particular string select line. Adjacent sets of vertical channel structures in neighboring stacks are not selected as the string select lines in neighboring stacks are not selected.

The memory further comprises linking elements. Each linking element includes a switch. The linking elements connect the word lines in the stacks of conductive strips to first patterned conductors above the stacks, or above the upper conductive strip configured as a string select line. The first patterned conductors are connected to a word line decoder. In each stack, the switches in the linking elements in the stack are responsive to signals in the string select line of the stack. In some embodiments, the switches in the linking elements are vertical channel transistors with the string select line acting as the gate terminal. Applying a signal to the string select line enables current to flow between the patterned conductors and the strips acting as word lines of the stack through the linking elements. During read and write operations in a memory element in a particular stack, a signal is asserted in the string select line of the stack to select a set of vertical channel structures. The word line decoder applies reading or programming voltages to linking elements in the plurality of stacks. The asserted signal in the string select line of the selected stack enables reading or programming voltages to be applied to the strips acting as word lines in the stack by the word line decoders through the linking elements. As no signal is applied to the string select lines in neighboring stacks, the word line decoders cannot apply programming voltages to the neighboring stacks, thereby reducing the overall word line capacitance.

In some embodiments, the string select line in the stack intersects the switches in the linking elements in the stack, acting as a gate-all-around terminal. In embodiments with staircase structure regions, the word lines provide landing areas for the linking elements. The linking elements include first conductors below the switches and second conductors above the switches. The first conductors connect the landings areas of the word lines in the staircase structure region to the switches of the linking elements, and the second conductors connect the switches to the first patterned conductors.

In some embodiments, the ground select line in each stack is connected to second patterned conductors through a linking element, the linking element including a switch responsive to signals in the string select line of the stack.

Methods for manufacturing memory devices including linking elements with switches responsive to signals in string select lines as described herein are also provided. In one embodiment, a method for manufacturing includes forming linking elements with first conductors, second conductors, and switches. The method for manufacturing further includes forming string select lines intersecting the switches of the linking elements.

Other aspects and advantages of the present invention can be seen on review of the drawings, the detailed description, and the claims, which follow.

BRIEF DESCRIPTION OF THE DRAWINGS

The invention will be described with respect to specific embodiments thereof, and reference will be made to the drawings, in which.

DETAILED DESCRIPTION

A detailed description of embodiments of the present invention is provided with reference to the FIGS. 1A-22. The following description will typically be with reference to specific structural embodiments and methods. It is to be understood that there is no intention to limit the technology to the specifically disclosed embodiments and methods but that the technology may be practiced using other features, elements, methods, and embodiments. Preferred embodiments are described to illustrate the present technology, not to limit its scope, which is defined by the claims. Those of ordinary skill in the art will recognize a variety of equivalent variations on the description that follows.

Figure 1A:
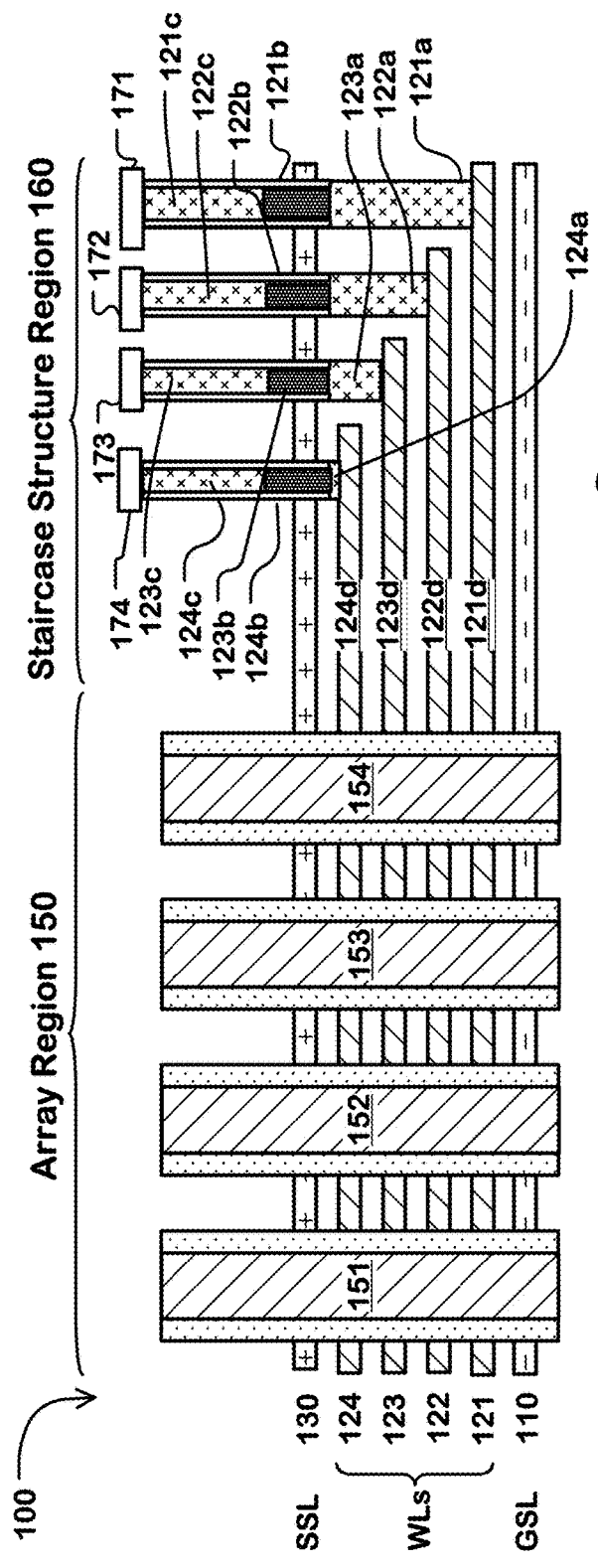
FIGS. 1A, 1B, and 1C illustrate a first example of a 3D memory device including linking elements with switches.

FIG. 1A illustrates a cross-sectional view of a first example of a 3D memory device 100, including an array region 150 and a staircase structure region 160. The array region 150 includes a stack of conductive strips, including a bottom level of conductive strips configured as a ground select line 110 (GSL), a plurality of intermediate levels of conductive strips configured as the word lines 121-124 (WLs), and an upper level of conductive strip configured as the select string line 130 (SSL). The conductive strips acting as the word lines, the string select lines, and the ground select lines can comprise a variety of materials including doped semiconductors, metals, and conductive compounds, including materials comprising Si, Ge, SiGe, SiC, TiN, TaN, W, and Pt. In some embodiments, the conductive strips in the upper and bottom levels (i.e., GSLs, SSLs) may be thicker than the conductive strips (WLs) in a plurality of intermediate levels. In some embodiments, the conductive strip in the upper and bottom levels may comprise a material different than the materials of the conductive strips in the plurality of intermediate levels.

Figure 1C:
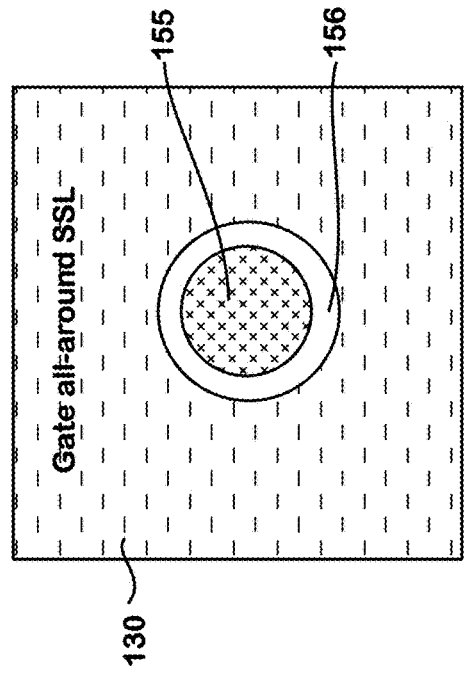
Figure 1B:
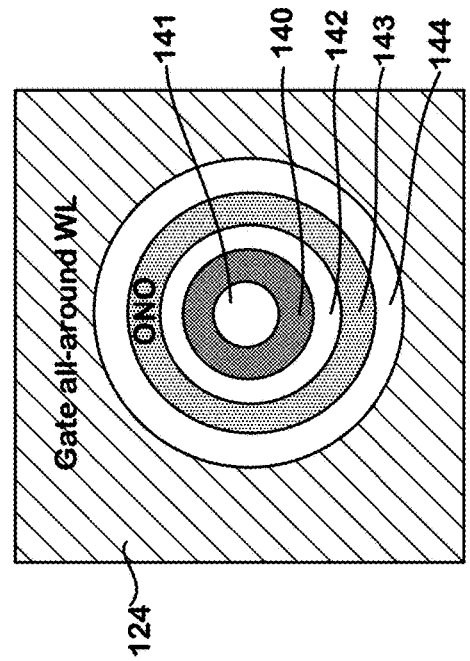

A plurality of vertical channel structures (e.g., vertical channel structures 151, 152, 153, 154) is arranged orthogonally to the stack of conductive strips. FIG. 1B is a horizontal cross-section of the vertical channel structure 151 at the level of the word line 124. The structure includes a pillar having a center core 140 of semiconductor material which extends vertically through the stack of word line layers. The core 140 may have a seam 141 through the middle that arises from the deposition technique. A dielectric charge trapping structure comprising, for example, a first layer 142 of silicon oxide, a layer 143 of silicon nitride and a second layer 144 of silicon oxide (referred to as ONO), or another multilayer dielectric charge trapping structure surrounds the core 140. The word line 124 intersects the vertical channel structure 151 to form a gate-all-around and a memory cell. Other multilayer dielectric charge trapping structures that can be used in the technology described herein are ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

The word lines 121, 122, 123, 124 provide landing pad areas 121d, 122d, 123d, 124d on the "step" regions in the staircase structure region 160. A plurality of linking elements land on the word lines 121, 122, 123, 124 in the landing pad areas 121d, 122d, 123d, 124d. The linking elements connect the conductive strips configured as word lines 121, 122, 123, 124 to first patterned conductors 171, 172, 173, 174. The first patterned conductors 171, 172, 173, 174 are connected to a word line decoder (not shown in FIG. 1).

The linking elements include first conductors 121a, 122a, 123a, 124a, switches 121b, 122b, 123b, 124b, and second conductors 121c, 122c, 123c, 124c. The first conductors 121a-124a of the linking elements are coupled to the word lines (e.g., 121-124) in respective intermediate levels of conductive strips in the array region 150 to the switches 121b-124b. The second conductors 121c-124c of the linking elements connect the switches 121b-124b to the first patterned conductors 171-174. The switches 121b-124b are on the same level as the upper level of conductive strips (i.e., the string select line 130).

Current flow between the first patterned conductors 171-174 and the word lines 121-124 through the linking elements are controlled by the switches 121b-124b. A "switch" is an electrical component that can interrupt current flow in a conducting path such a conducting path including the word line 121, the first conductor 121a, the second conductor 121c and the first patterned conductor 171. A switch can remove or restore the conducting path in response to an applied signal. The switches 121b-124b can be turned "on" when an ON state signal is applied to the switch by the string select line 130. For example, current is allowed to flow between the first patterned conductor 171 and the word line 121 through the first conductor 121a, the switch 121b, and the second conductor 121c when a signal is asserted in the string select line 130. If an ON state signal is not asserted in the string select line 130, current is not allowed to flow between the first patterned conductor 171 and the word line 121.

The switches 121b-124b can be vertical channel transistors. FIG. 1C is a horizontal cross-section of the switch 124b at the level of the string select line 130. The switch includes a channel 155 of semiconductor material, such as Si, Ge, SiGe, GaAs, and SiC. The semiconductor material may have N+ doping. A dielectric layer 156, comprising a dielectric material and acting as the gate oxide of the switch 124b, surrounds the channel 155. The string select line 130 is intersected by the switch 124b and forms a gate-all-around terminal for the switch 124b.

In some embodiments, the ground select line 110 may be connected to a second patterned conductor through a linking element including a switch. The switch in the linking element connected the ground select line 110 to the second patterned conductor may be responsive to signals in the string select line 130.

In another 3D NAND flash memory technology with a vertical channel structure, vertical thin-channel cells in the memory can be arranged along vertical active pillars which support cells on opposing sides of one pillar, and in some configurations comprise U-shaped semiconductor thin-film structures in which a NAND string extends down one side and up the other side of a single pillar. The active pillars are disposed between stacks of conductive strips operable as word lines with memory elements in between as described in U.S. Pat. No. 9,524,980, issued 20 Dec. 2016, which is incorporated by reference as if fully set forth herein. As a result of these structures, two memory cells are formed per frustum of the active pillar, where each memory cell at the frustum includes a channel in the U-shaped semiconductor thin-film structure on one side of the active pillar. In alternative approaches, vertical channel structures can support even and odd NAND strings on opposing sides of each vertical channel structure. In such embodiments, the ground select line may be located in the upper level and connected to a second patterned conductor through a linking element including a switch. The switch in the linking element connecting the ground select line to the second patterned conductor may be responsive to signals in the string select line.

Figure 2:
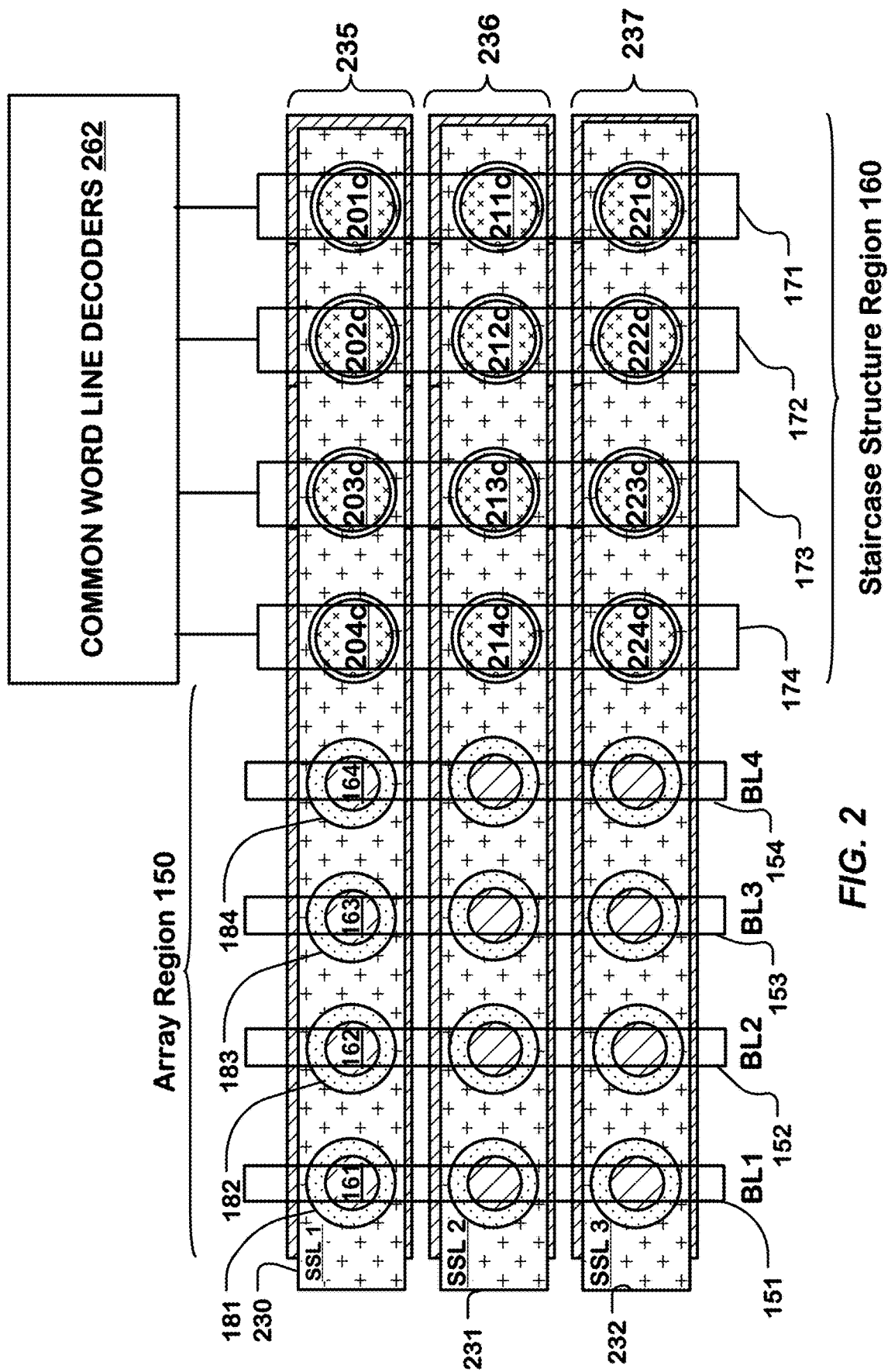
FIG. 2 illustrates a top view of the 3D memory device in FIG. 1A.

FIG. 2 illustrates an upper view of the memory device 100 in FIG. 1, including the array region 150 and the staircase structure region 160. The array region 150 includes a plurality of stacks of conductive strips, including stacks 235, 236 and 237. The plurality of stacks of conductive strips includes an upper level of conductive strips. The upper level of conductive strips includes a string select line for each stack: a string select line SSL1 230 for the stack 235, a string select line SSL2 231 for the stack 236 and a string select line SSL3 232 for the stack 237. A plurality of vertical channel structures (e.g., 161-164) is arranged orthogonally to the plurality of stacks of conductive strips. Memory elements (e.g., 181-184) are disposed in interface regions at crosspoints between side surfaces of the plurality of stacks and the plurality of vertical channel structures. Bit lines BL1 151, BL2 152, BL3 153 and BL4 154 are coupled to vertical channel structures (e.g., 161-164) in respective columns in the plurality of vertical channel structures.

Each stack also includes a plurality of linking elements (e.g., the linking elements 201c-204c for the stack 235, the linking elements 211c-214c for the stack 236 and the linking elements 221c-224c for the stack 237) disposed in the staircase structure region 160. The switches in the linking elements are at the same level as the upper level of conductive strips. The string select lines (e.g., SSL1 230) act as the gate-all-around terminal for the switches in the linking elements (e.g., linking elements 201c-204c) in the same stack (e.g., stack 235). The linking elements are coupled to the first patterned conductors (e.g., 171-174) and to word lines in respective intermediate levels in the plurality of intermediate levels in the array region. The first patterned conductors (e.g., 171-174) are coupled to the word line decoder 262.

Figure 3:
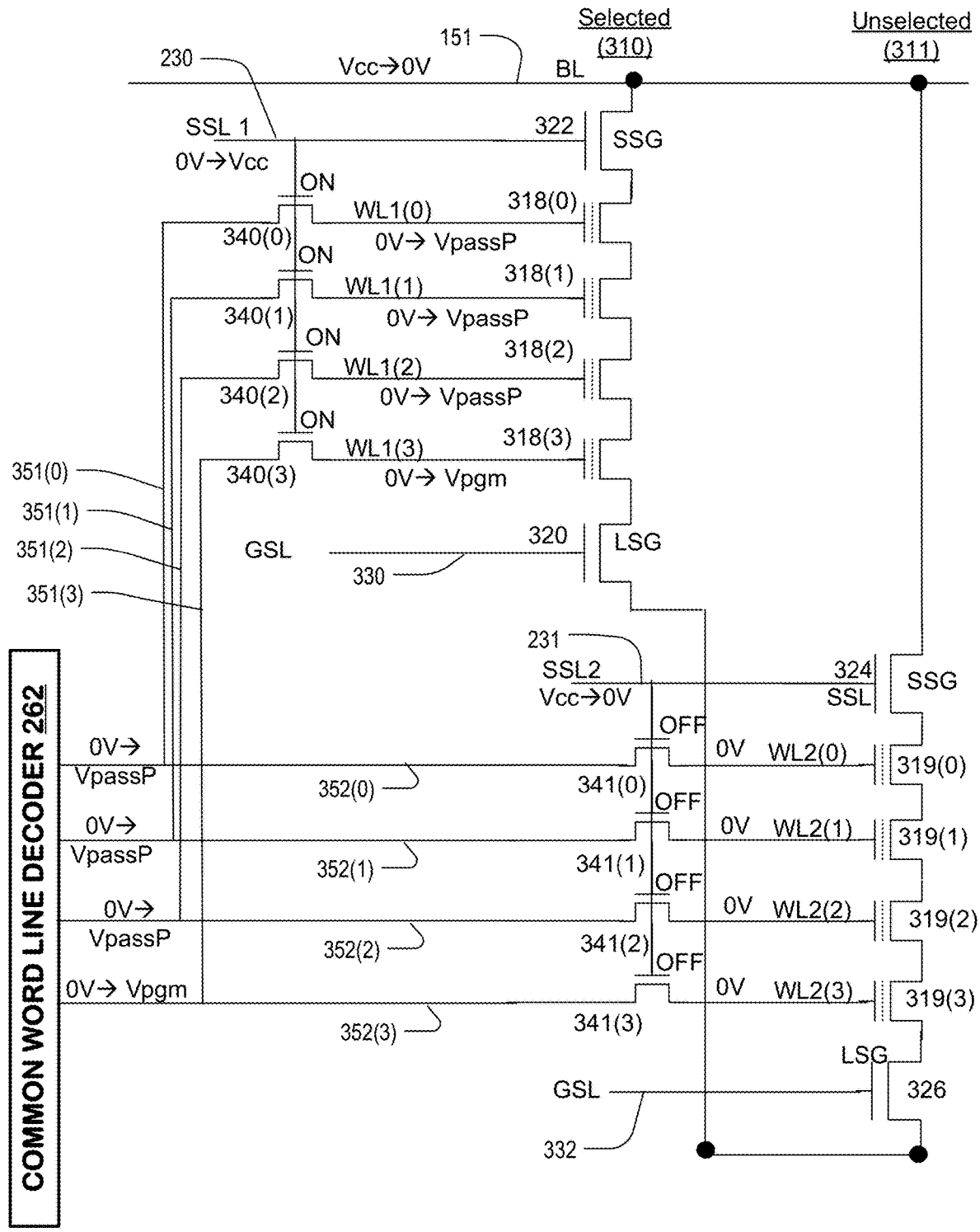
FIG. 3 is a simplified circuit diagram showing two vertical channel structures of the 3D memory device of FIG. 2.

FIG. 3 is a simplified circuit diagram showing two vertical channel structures in two neighboring stacks of the 3D memory device of FIG. 2. As shown, each structure supports a respective string 310 or 311 of series-connected memory cells. The memory cells in the string 310 are labeled 318(0), 318(1), 318(2), 318(3) (representatively 318), whereas the memory cells in the string 311 are labeled 319(0), 319(1), 319(2), 319(3) (representatively 319). Each of the memory cells 318 and 319 includes a source, a drain, and a control gate. Because of the electrical interchangeability of source and drain in many transistors, these two terminals are sometimes referred to herein collectively as "current path terminals."

The string 310 also includes a string select gate 322 and a lower select gate 320. Each of the string select gate 322 and the lower select gate 320 includes a control gate electrode and two current path terminals, and the current path terminals are connected in series with the current path terminals of the memory cells 318 of the string. Similarly, the string 311 also includes a string select gate 324 and a lower select gate 326 series connected in series with the current path terminals of the memory cells 319 of the string. The two strings share a single bit line conductor 151, connected to the drain terminal of both the string select gates. The control gates of the two string select gates are connected to separate string select lines (230 in string 310 and 231 in string 311), thereby permitting selectable communication between the bit line 151 and the respective memory cell strings 310 and 311. The lower select gate 320 in string 310 is controlled by the ground select line GSL 330 and the lower select gate 326 in string 311 is controlled by the ground select line GSL 332. In other embodiments, the lower select gate 320 in string 310 and the lower select gate 326 in string 311 can be controlled by the same ground select line.

The memory also includes "i" separate word line conductors WL1(0), WL1(1), WL1(2), WL1(3) (representatively WL1), each in a separate level of conductive strips, and one corresponding to each of the memory cells 318 in string 310, and "i" separate word line conductors WL2(0), WL2(1), WL2(2), WL2(3) (representatively WL2), each in a separate level of conductive strips, and one corresponding to each of the memory cells 319 in string 311. Corresponding memory cells 319 in string 311 are located in corresponding levels to those in string 310. Each of the word line conductors WL1 is connected to the control gate electrode of the corresponding memory cell 318 in string 310, and each of the word line conductors WL2 is connected to the control gate electrode of the corresponding memory cell 319 in string 311. Thus, it can be seen that each of the strings intersect the word line conductors, and the memory cells of the string are located at cross-points between the word line conductors and the strings.

The word lines WL1(0), WL1(1), WL1(2), WL1(4) are connected to the word line decoder 262 through the linking elements 351(0), 351(1), 351(2), 351(3) (representatively 351) for the string 310. The word lines WL2(0), WL2(1), WL2(2), WL2(4) are connected to the word line decoder 262 through the linking elements 352(0), 352(1), 352(2), 352(3) (representatively 352) for the string 311. The linking elements 351 include the switches 340(0), 340(1), 340(2), 340(3) (representatively 340). The linking elements 352 include the switches 341(0), 341(1), 340(2), 341(3) (representatively 341). The switches 340 are controlled by the string select line SSL1 230, and the switches 341 are controlled by the string select line SSL2 231.

In one example configuration, in order to program a cell, a low voltage such as 0V is placed on the bit lines which are to be programmed, and a higher "inhibit" voltage such as 3-5V is placed on the bit lines which are to remain in the erased state. The SSL gate in the selected string 310 is activated. The word line decoder 262 applies a high program voltage Vpgm which may be around 18-24V to linking elements 351 and 352 connected to selected word lines (e.g., WL1(3)). The word line decoder 262 applies a pass voltage VpassP to linking elements 351 and 352 connected to all the unselected word lines. VpassP may, for example, be 5-10V in such a device. The SSL gate in the unselected string 311 is deactivated, allowing the channels of the transistors 319 in the unselected string 311 to float.

The signal in SSL1 230 turns on the switches 340 in the linking elements 351. Therefore, the high program voltage Vpgm is passed to the WL1(3), and the pass voltage VpassP is passed onto WL1(0), WL1(1) and WL1(2) connected to the string 310. As no signal is asserted in SSL2 231, the switches 341 in the linking elements 351 remain off. Therefore, the high program voltage Vpgm and the pass voltages VpassP are not passed onto the word lines connected to the string 311. Therefore, cross-coupling is reduced between the word lines connected to selected string 310 and the unselected string 311, reducing the probability of a programming glitch in the unselected string 311.

Figure 4:
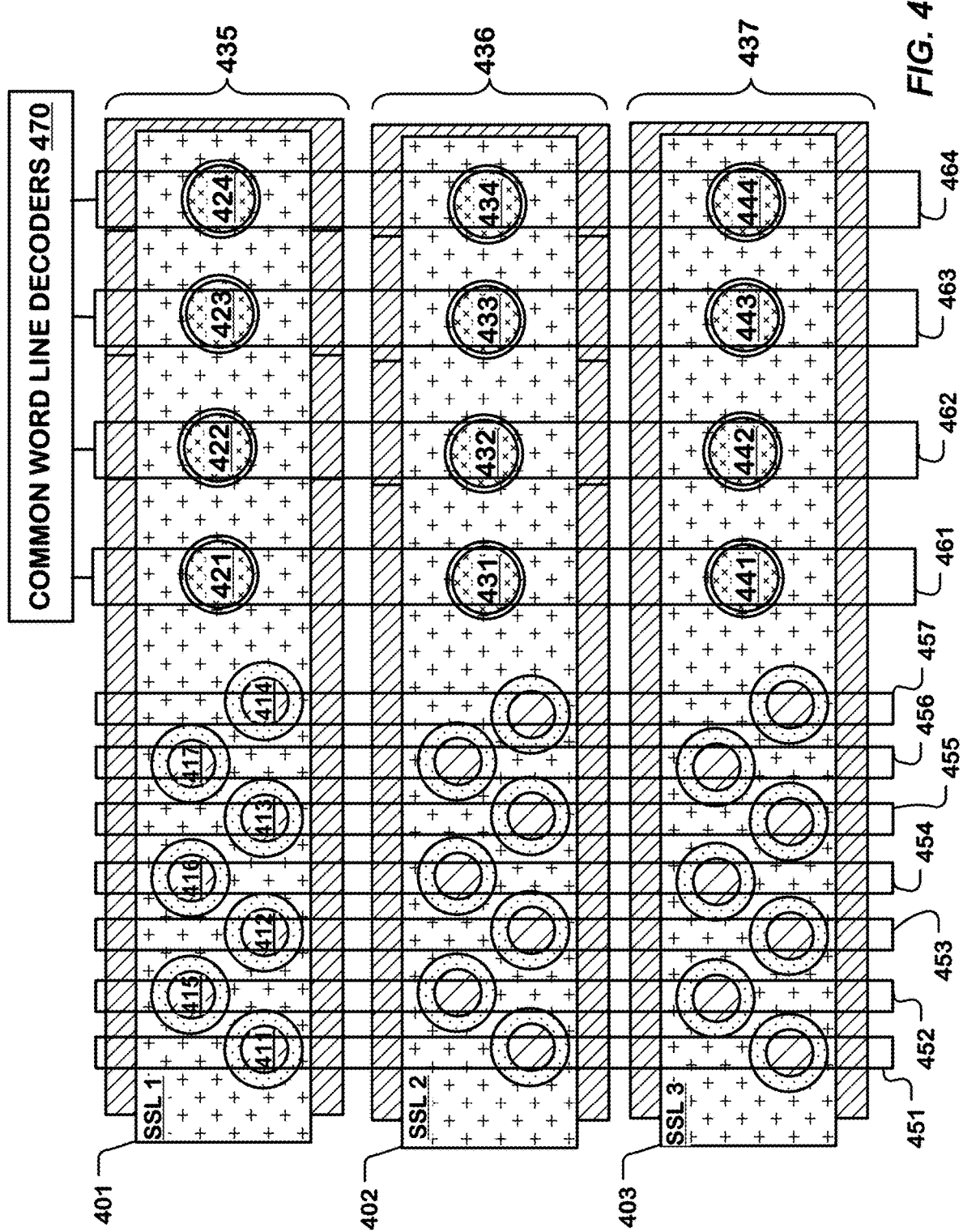
FIG. 4 illustrates a top view of a second example of a 3D memory device including linking elements with switches.

FIG. 4 illustrates a top view of a second example of a 3D memory device with two rows of vertical channel structures in each stack. Each stack includes a string select line (e.g., string select line SSL1 401 for stack 435, string select line SSL2 402 for stack 436, string select line SSL3 403 for stack 437) that is wide enough to intersect two rows of vertical channel pillars. The string select line SSL1 401 in stack 435 intersects a first row of vertical channel pillars consisting of vertical channel pillars 415, 416 and 417 and a second row of pillars consisting of vertical channel pillars 411, 412, 413, and 414. Each of the bit line conductors 451-457 superposes a respective column of the vertical channel pillars, and each of the vertical channel pillars underlies one of the bit line conductors. The two rows of vertical channel structures permit a higher density of vertical structures with a lower number of string select lines, thereby enabling more data storage as described in U.S. Pat. No. 9,373,632, issued 21 Jun. 2016.

Each stack also includes a plurality of linking elements (e.g., linking elements 421-424 for stack 435, linking elements 431-434 for stack 436 and linking elements 441-444 for stack 437. The switches in the linking elements are at the same level as the upper level of conductive strips. The string select lines (e.g., SSL1 401) act as the gate-all-around for the switches in the linking elements (e.g., linking elements 421-424) in the same stack (e.g., stack 435). The linking elements are coupled to the first patterned conductors (e.g., 461-464) and to word lines in respective intermediate levels in the plurality of intermediate levels in the array region. The first patterned conductors (e.g., 461-464) are coupled to the word line decoder 470.

Figure 5:
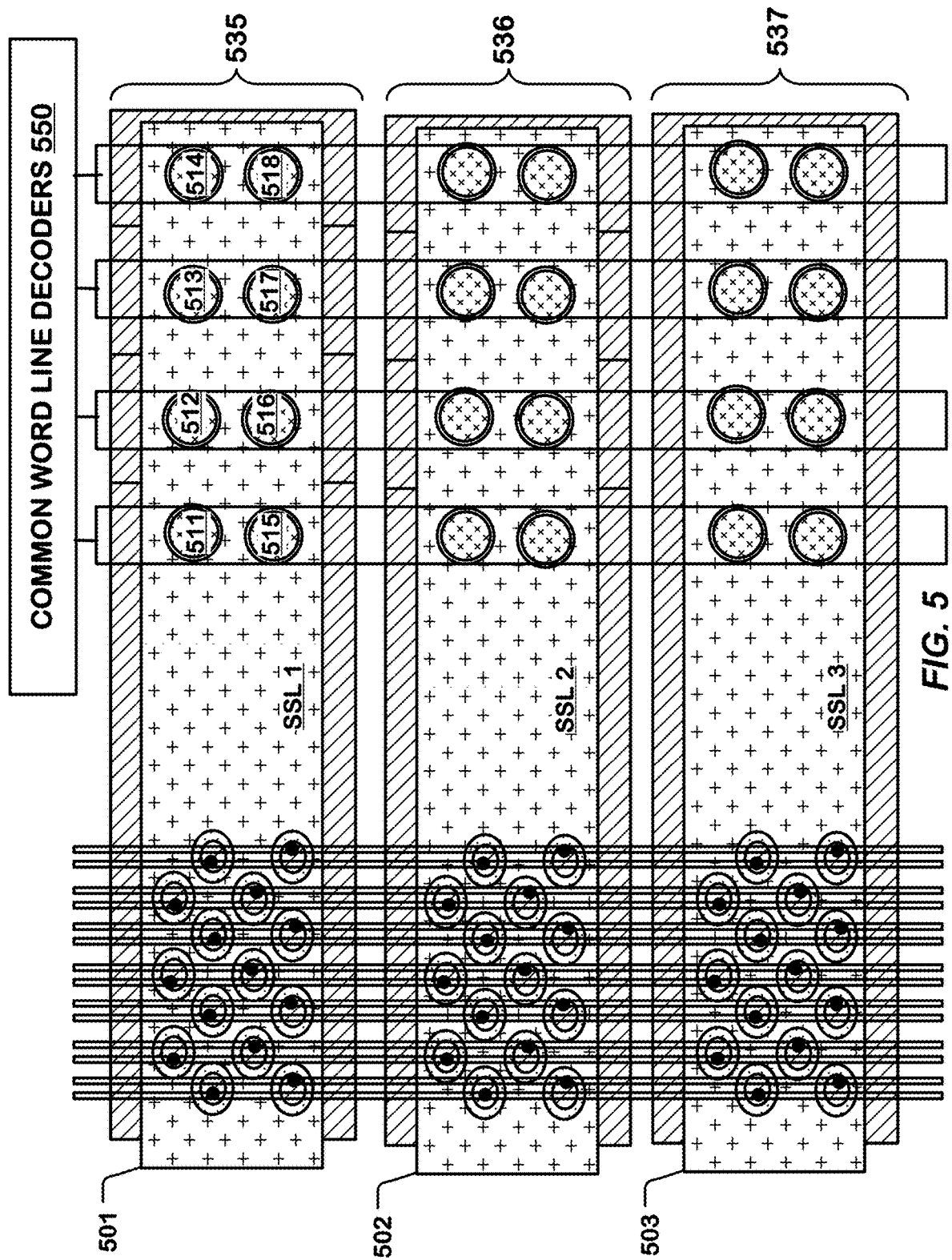
FIG. 5 illustrates a top view of a third example of a 3D memory device including linking elements with switches.

FIG. 5 illustrates a top view of a third example of a 3D memory device with four rows of vertical channel structures and two rows of linking elements in each stack. Each stack includes a string select line (e.g., SSL1 501 for stack 535, SSL2 502 for stack 536 or SSL3 503 for stack 537) that is wide enough to intersect four rows of vertical channel pillars and two rows of linking elements. A pair of bit line conductors superposes a respective column of the vertical channel pillars, and each of the vertical channel pillars in a column of vertical channel structures underlies one of the bit line conductors from the pair of bit line conductors superposed on top of the column.

The switches in the linking elements are at the same level as the upper level of conductive strips. The string select lines (e.g., SSL1 501) acts as the gate-all-around for the switches in the two rows of linking elements (e.g., linking elements 511-518) in the same stack (e.g., stack 535). The linking elements are coupled to the first patterned conductors and to word lines in respective intermediate levels in the plurality of intermediate levels in the array region. The first patterned conductors are coupled to the word line decoder 550.

FIGS. 6 through 21 illustrate structures during some manufacturing stages for a 3D memory device with switches in the linking elements as described herein, like that of FIG. 1.

Figure 6:
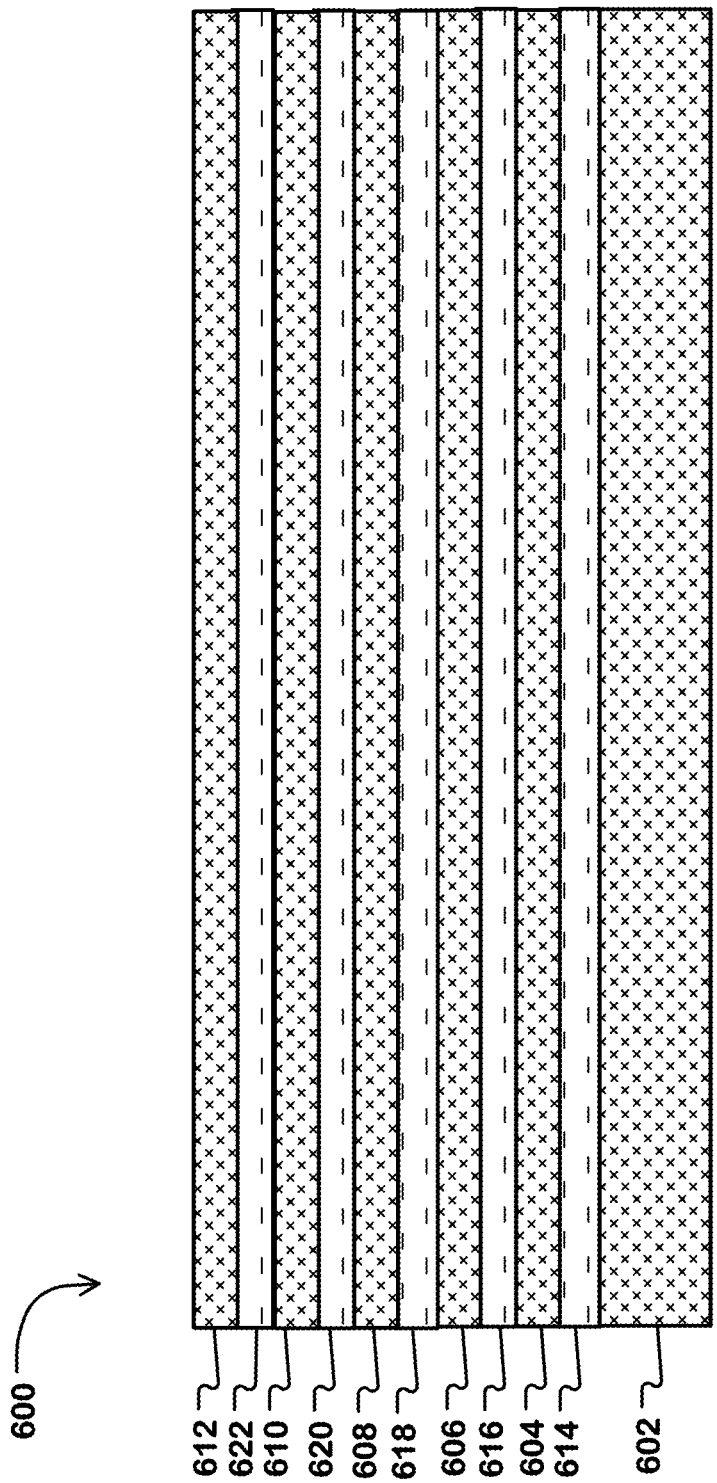
FIGS. 6, 7, 8, 9, 10, 11, 12, 13, 14, 15, 16, 17, 18, 19 and 20 illustrate structures during manufacturing stages for the 3D memory device including linking elements with switches as described herein, like that of FIG. 1A.

FIG. 6 illustrates a stage of the process flow after forming a plurality of sacrificial layers on upper insulating layer 602. To form the stack 600 shown in FIG. 6, a plurality of layers 614, 616, 618, 620, 622 of a sacrificial material, such as SiN, separated by layers of insulating material 604, 606, 608, 610, 612 are disposed over the insulating layer 602. The layers of insulating material can comprise silicon dioxide deposited in a variety of ways as known in the art. Also, the layers of insulating material can comprise other insulating materials, and combinations of insulating materials. In this example, all of the insulating layers consist of the same material. In other examples, different materials can be used in different layers as suits a particular design goal. After the plurality of layers is formed, multiple patterned etches are performed on the structure to form a staircase structure region.

Figure 7:
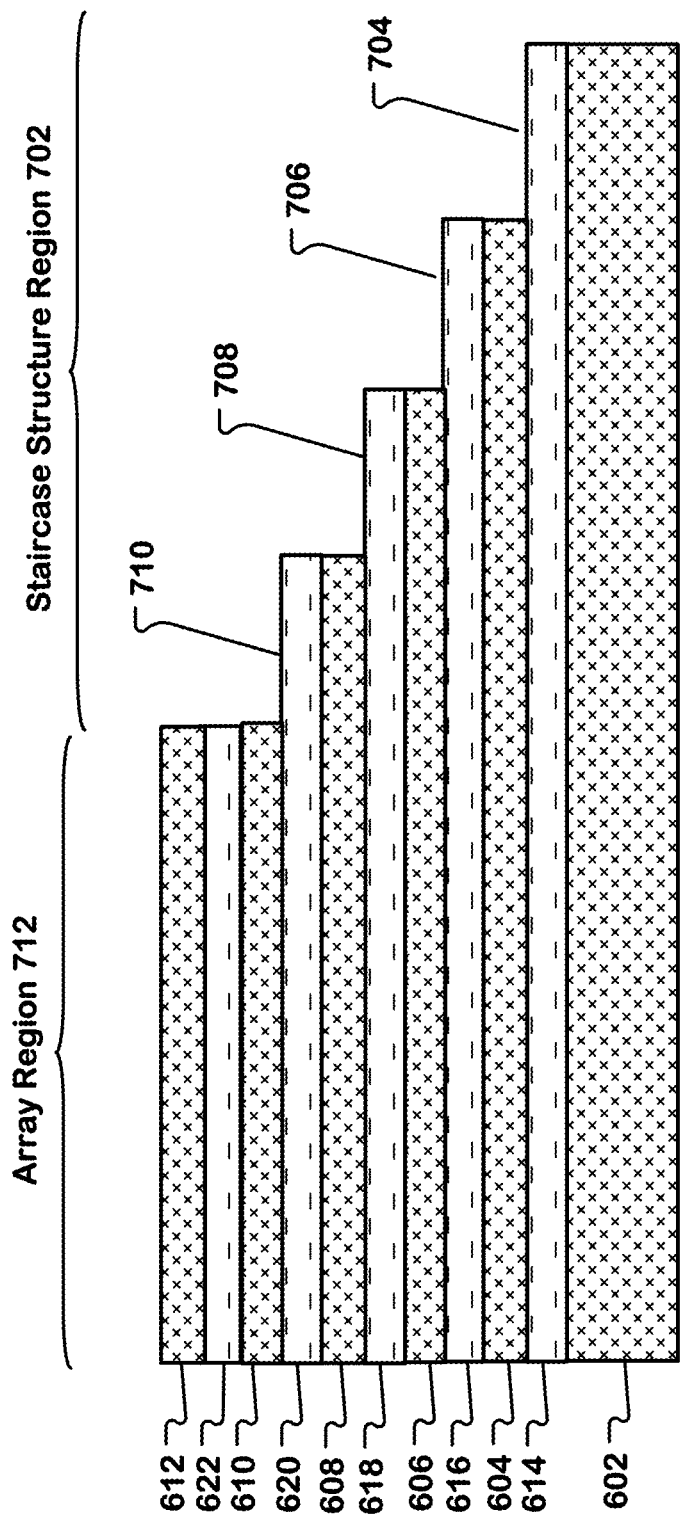

FIG. 7 illustrates a stage of the process after forming the staircase structure region 702. The array region 712 is not etched. The multiple patterned etches create landing areas 704, 706, 708, 710 on the plurality of layers 614, 616, 618, 620, 622 of sacrificial materials. The multiple patterned etches can be performed by using a step mask to etch multiple levels of the structure in a multilevel etch using anisotropic etching so that relatively straight or vertical sidewalls are formed in the opening of the step mask, continuing with the example in which a sacrificial layer is on the upper portion of the insulating layer in each level, rather than vice versa. The procedure can involve using a sequence of etch chemistries, designed for anisotropic etching of the sacrificial layer stopping on the insulating layer, and then an etch chemistry designed for anisotropic etching of the insulating layer stopping on the sacrificial layer, and so on, for the number of levels desired to be etched. Other techniques can involve, for example, a timed etch chemistry which can remove both types of layers, stopping before the desired level is reached, and then changing to such chemistries which are selective, and can stop on a specific layer.

Figure 8:
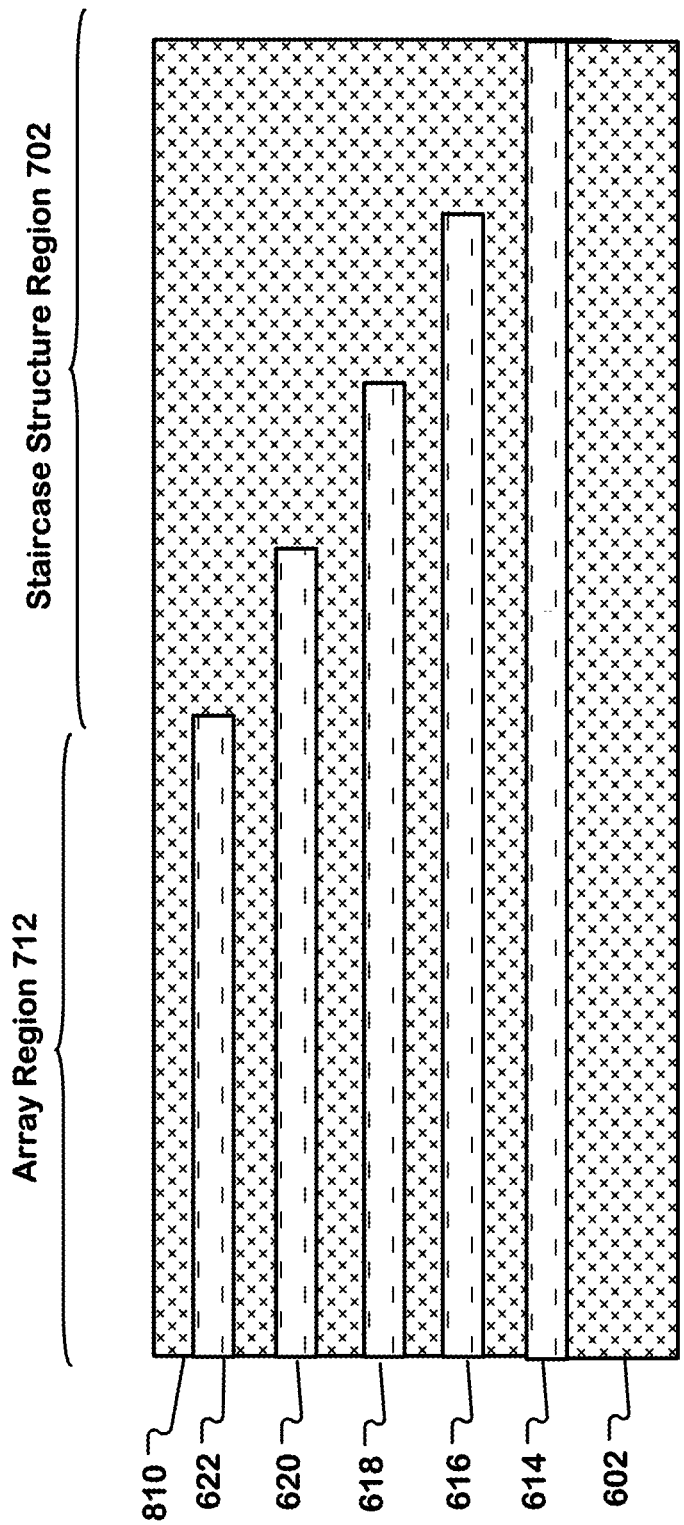
Figure 9:
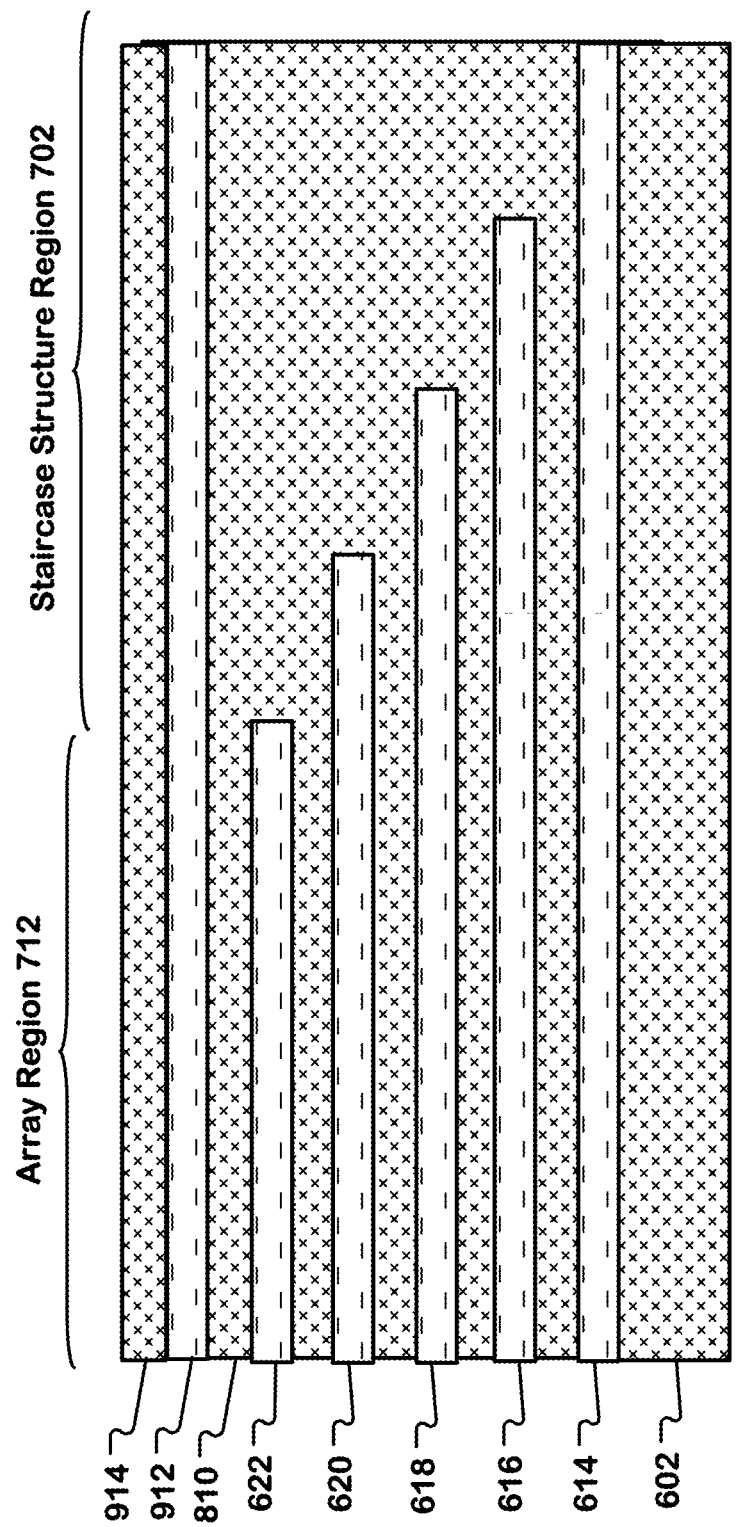

FIG. 8 illustrates a stage of the process after insulating materials 810 are deposited on the staircase structure region 702. FIG. 9 illustrates a stage of the process flow after forming a sacrificial layer 912 and a layer of insulating materials 914 on top of the structure in FIG. 8.

Figure 10:
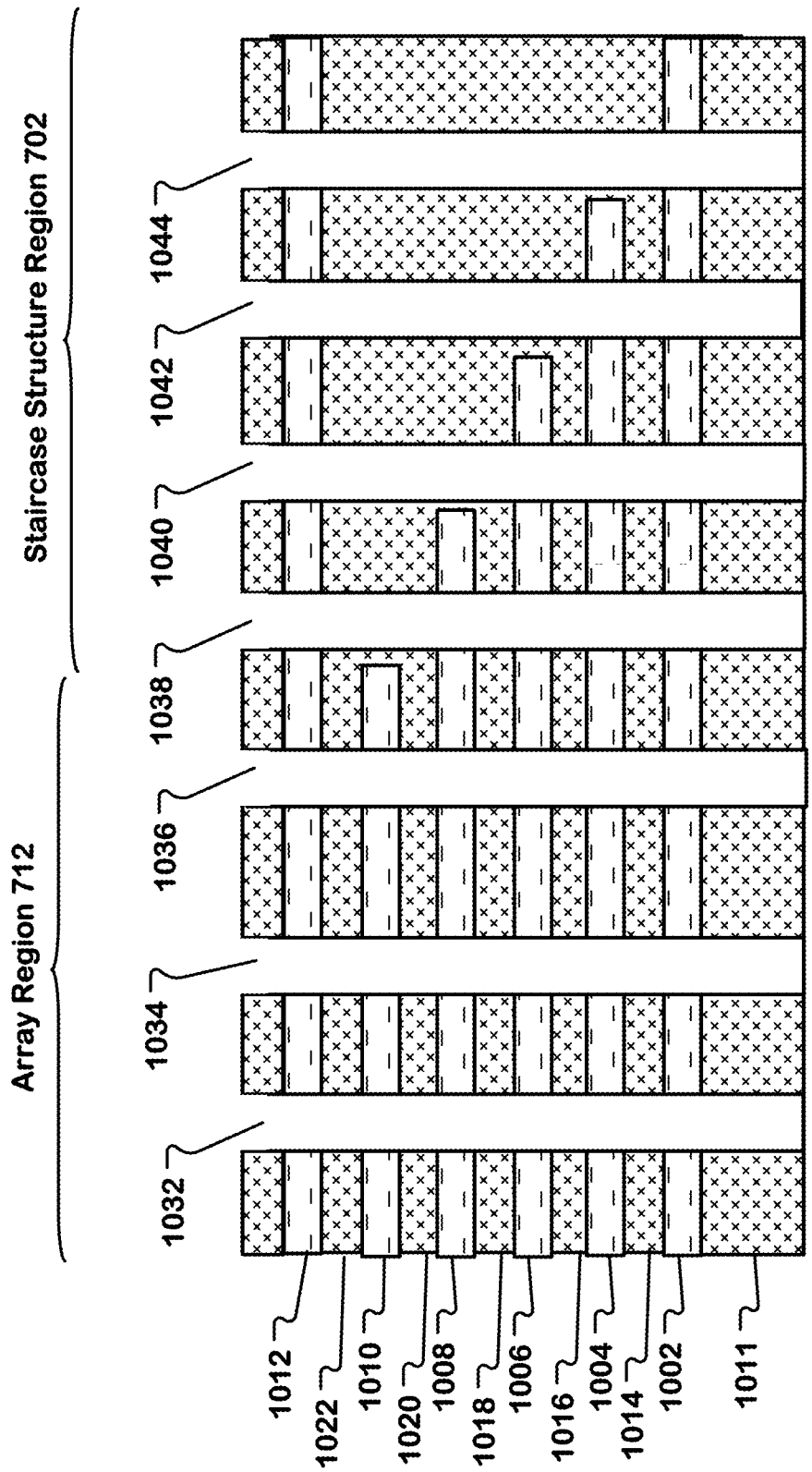

FIG. 10 illustrates a stage of the process after etching the plurality of layers in the array region 712 and the staircase structure region 702 to define a plurality of stacks of sacrificial strips and openings 1032, 1034, 1036, 1038, 1040, 1042 and 1044. The opening may be a trench or a hole. For the purpose of this application, a process flow is shown where the etching process defines one or more openings. However, the technology disclosed herein can also be formed in trenches.

The stacks include sacrificial strips 1002 in a bottom level, sacrificial strips 1004, 1006, 1008, 1010 in a plurality of intermediate levels and sacrificial strips 1012 in an upper level. The stacks include insulating material strips 1011, 1014, 1016, 1018, 1020, 1022 of insulating materials separating the sacrificial strips from one another.

Figure 11:
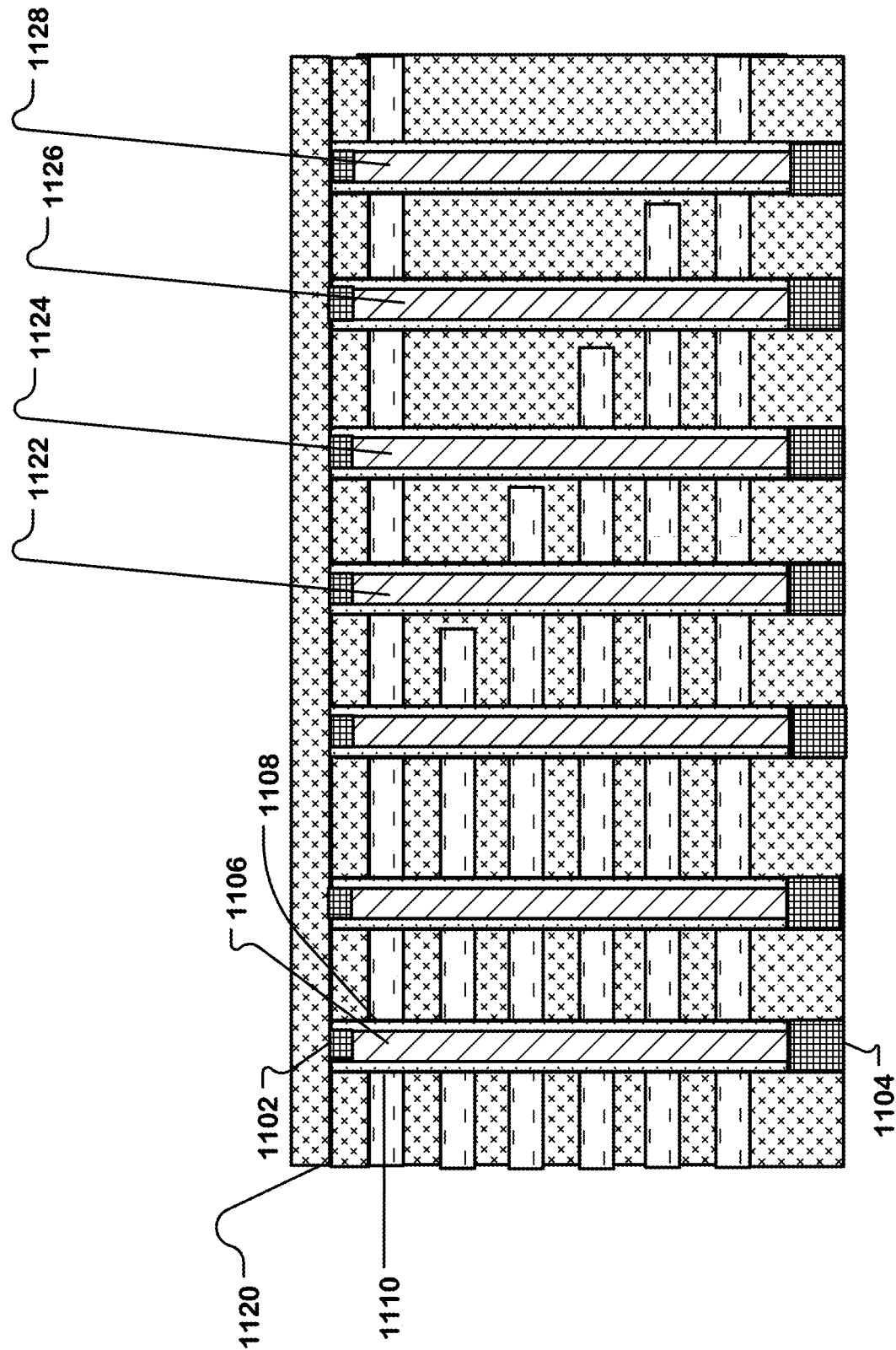

FIG. 11 illustrates a stage of the process after forming vertical channel structures in the openings 1032, 1034, 1036, 1038, 1040, 1042 and 1044. The vertical channel structures 1122, 1124, 1126 and 1128 in the step region may support the insulating strips in the next manufacturing steps when the sacrificial strips are selectively removed. Layer 1104 is SEG undoped Si or P-type lightly doped Si. forming memory layers 1108, 1110 on sides of sacrificial strips, filling the openings with an insulating material 1106, such as un-conformal silicon oxide, and forming second semiconductor pads (e.g., semiconductor pad 1102) above the insulating material, as described in U.S. patent application Ser. No. 15/950,021, filed 10 Apr. 2018. A layer 1120 of insulating materials is formed over the vertical channel structures. The first and second semiconductor pads can comprise semiconductor materials, such as Si, polysilicon, Ge, SiGe, GaAs, and SiC. The memory layers 1108 and 1110 contact side surfaces of the plurality of sacrificial strips. The memory layer can comprise a multilayer data storage structure including a first layer of silicon oxide, a layer of silicon nitride and a second layer of silicon oxide, examples of which are discussed above.

Figure 12:
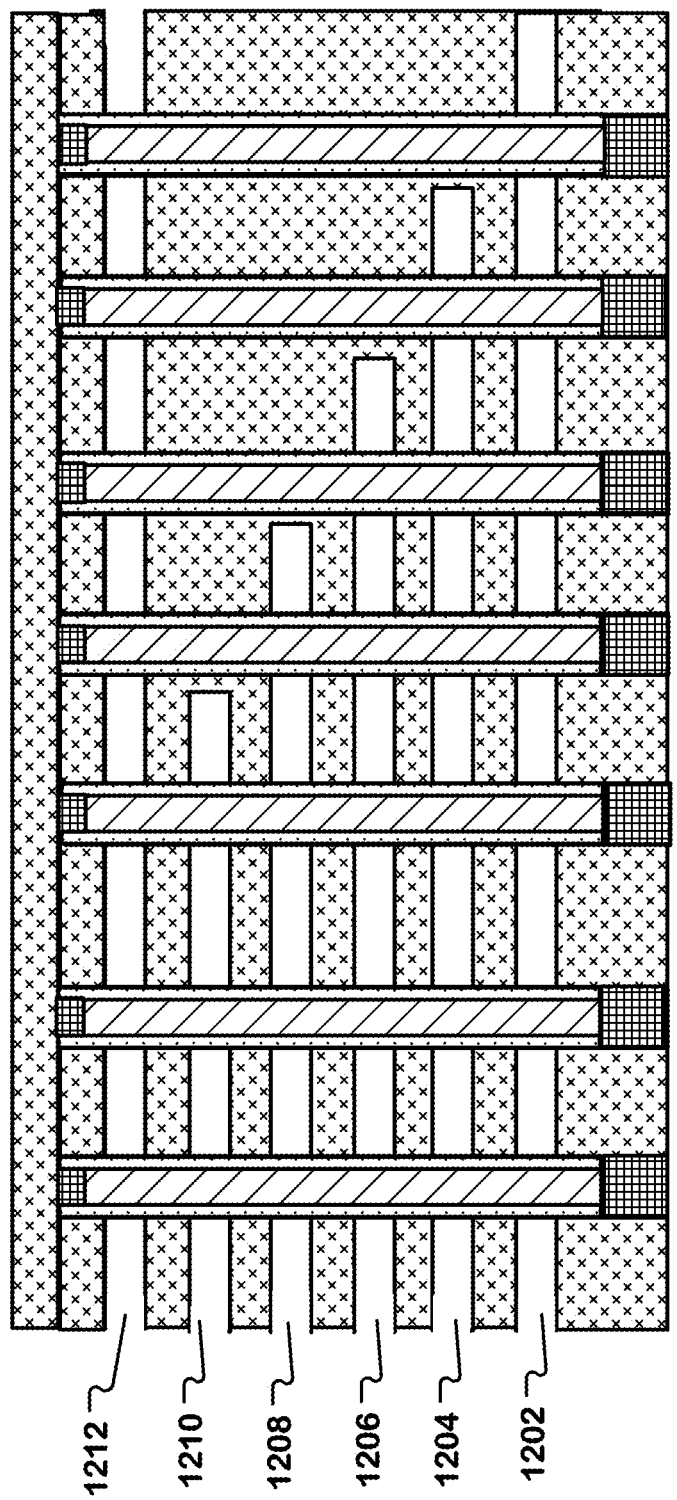

FIG. 12 shows the structure after applying a process to selectively remove the sacrificial strips in the stacks to form voids between the insulating strips. Thus, in the stacks in the figure, voids 1202, 1204, 1206, 1208, 1210, 1212 are opened after removal of the corresponding sacrificial strips 1002, 1004, 1006, 1008, 1010, 1012.

The sacrificial strips can be removed using a selective etch process. For example, etch chemistries suitable for selectively etching SiN with phosphoric acid $H_3PO_4$ may be used. Phosphoric acid is more probable of etching the sacrificial strips 1002, 1004, 1006, 1008, 1010, 1012 than the insulating material strips 1011, 1014, 1016, 1018, 1020, 1022. As a result of the selective etching, the insulating strips (e.g., 1011, 1014, 1016, 1018, 1020, and 1022) remain suspended between the vertical channel structures, with voids allowing access to the selective etch chemistry between the insulating strips in the voids.

Figure 13:
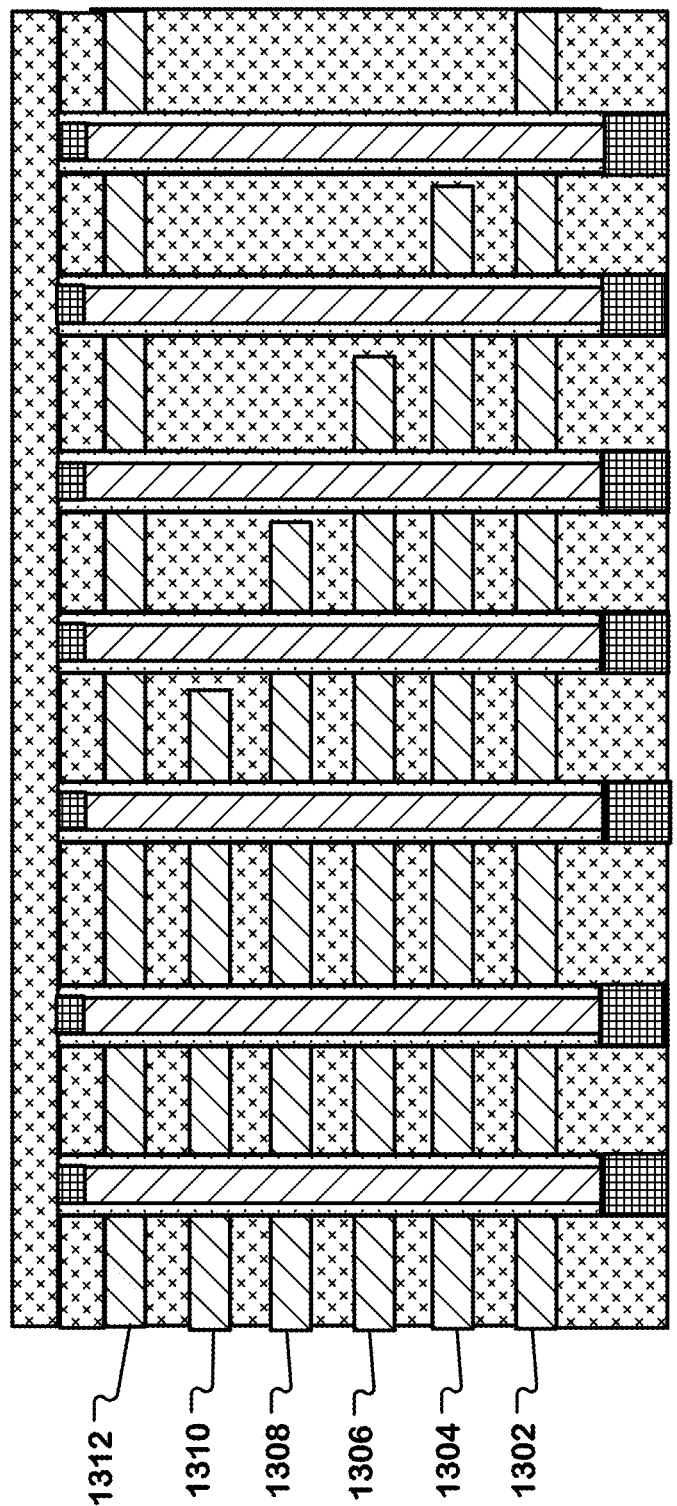

FIG. 13 shows the structure after filling the voids 1202, 1204, 1206, 1208, 1210, 1212 with a conducting material to be used in the formation of conductive strips 1302 in the bottom level to be configured as the ground select line, conductive strips 1304, 1306, 1308, 1310 in the plurality of intermediate levels to be configured as the word lines and conductive strips 1312 in the upper level to be configured as the string select line. The conducting material can be deposited using highly conforming chemical vapor deposition or atomic layer deposition.

Figure 14:
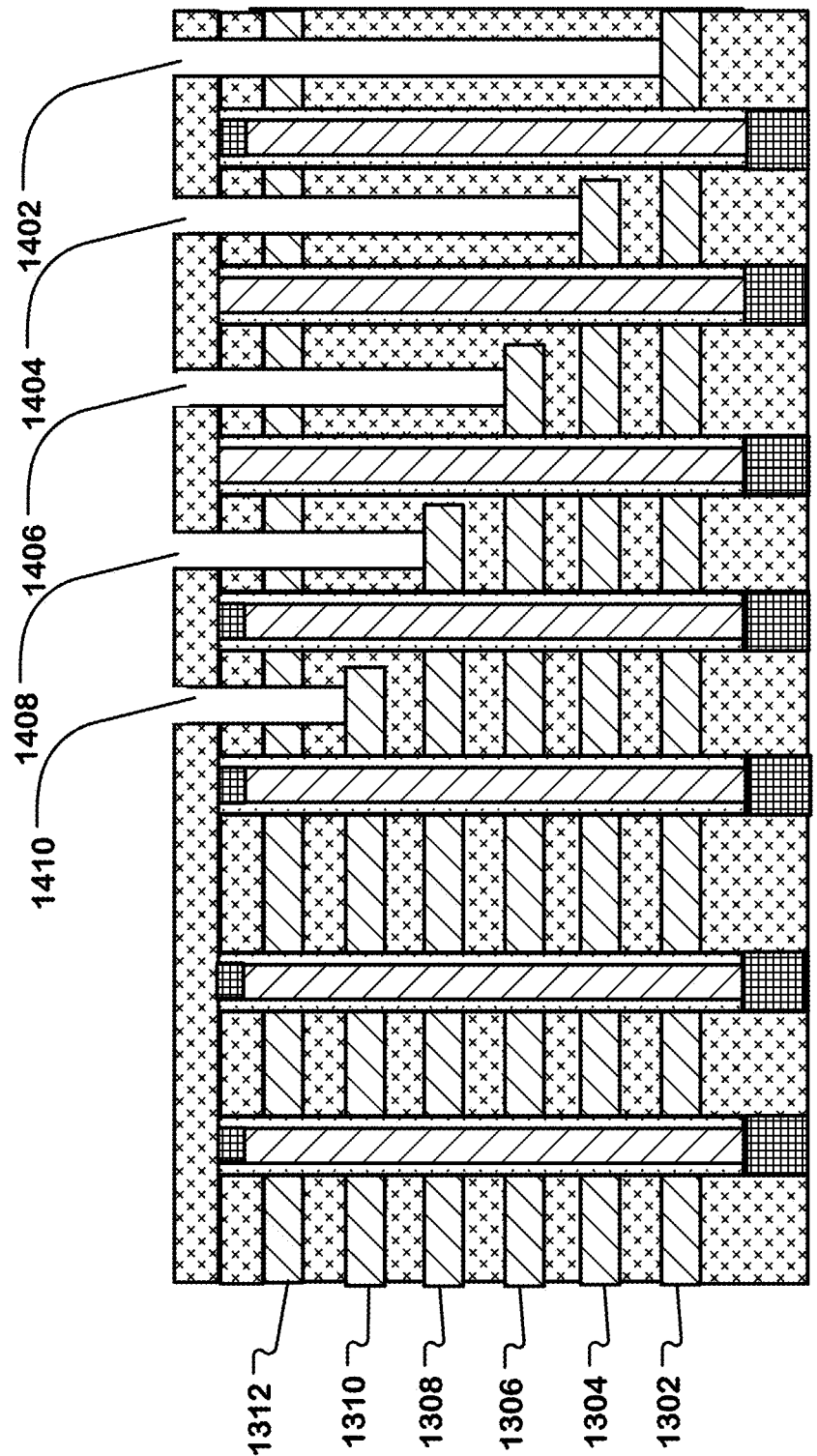

FIG. 14 illustrates a stage of the process after etching the plurality of stacks in the staircase structure region to define a plurality of first openings 1402, 1404, 1406, 1408 and 1410. The first openings extend below the upper level of conductive strips and stop at the landing pads of the words lines at the intermediate levels of conductive strips and the landing pads of the ground select line at the bottom level of conductive strips. The openings comprise high aspect ratio vias within which the multiple parts of the linking elements are formed in a self-aligned procedure.

Figure 15:
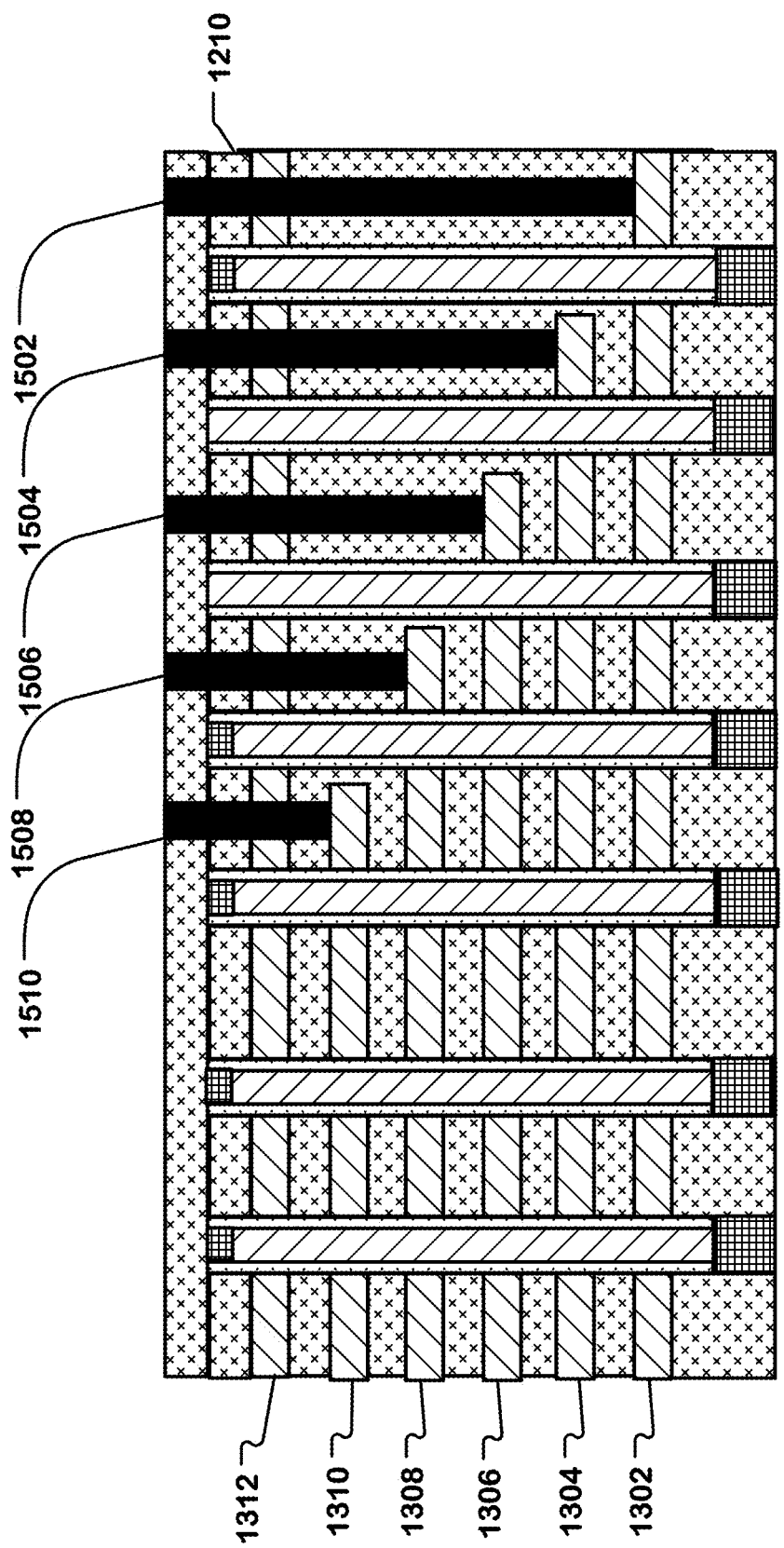

FIG. 15 illustrates a stage of the process after filling the plurality of first openings with a second conducting material 1502, 1504, 1506, 1508 and 1510. The second conducting material may be a metal, such as tungsten (W), aluminum (Al), copper (Cu) and other materials. The second conducting material can be different or same as the first conducting material.

Figure 16:
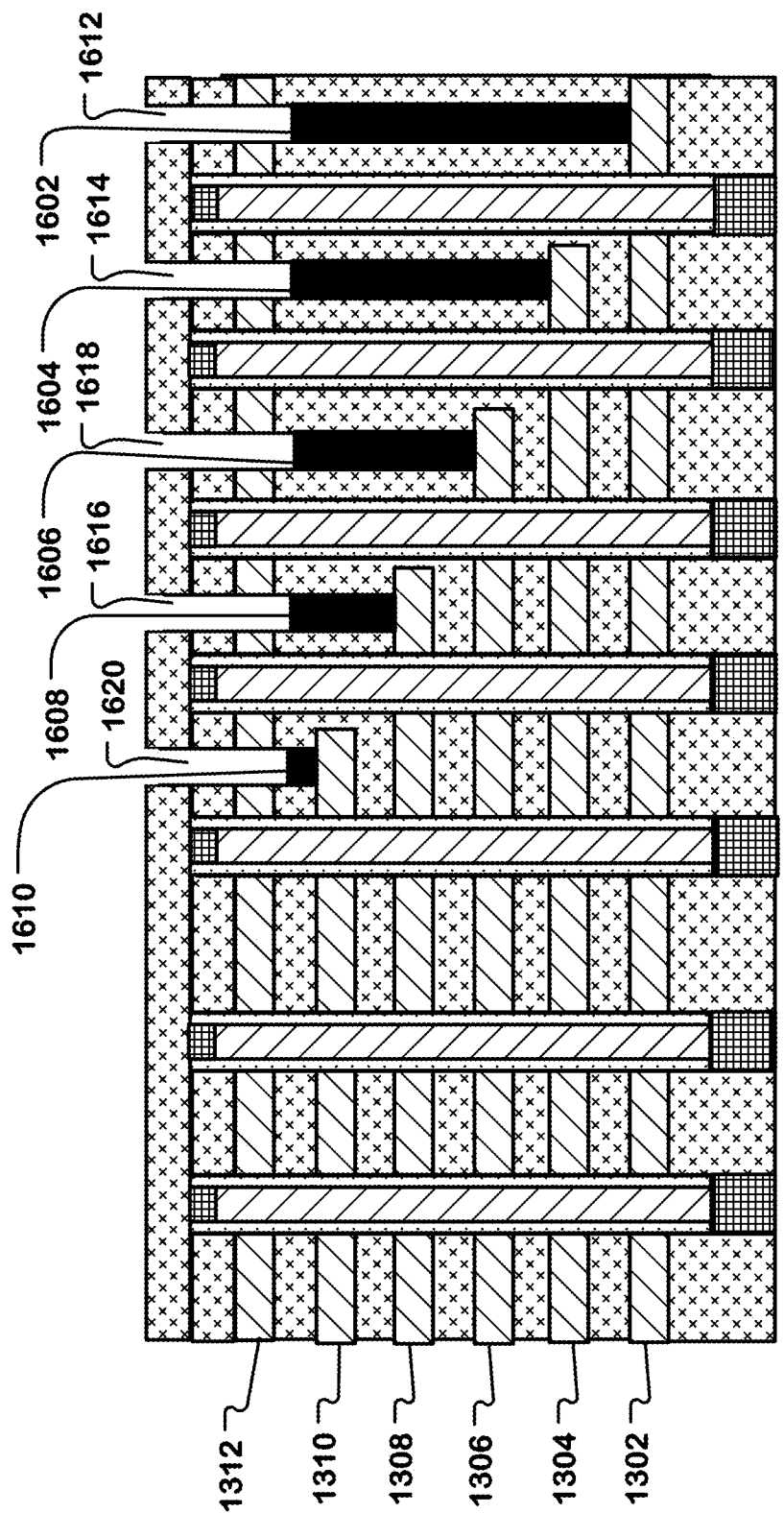

FIG. 16 illustrates a stage of the process after etching the second conducting material to form first conductors 1602, 1604, 1606, 1608 and 1610 and second openings 1612, 1614, 1616, 1618 and 1620 self-aligned within the vias. The second openings extend below the upper level of conductive strips (or a strip configured as a string select line SSL) but stop above the landing pads of the word lines at the intermediate levels of conductive strips and the landing pads of the ground select line at the bottom level of conductive strips.

Figure 17:
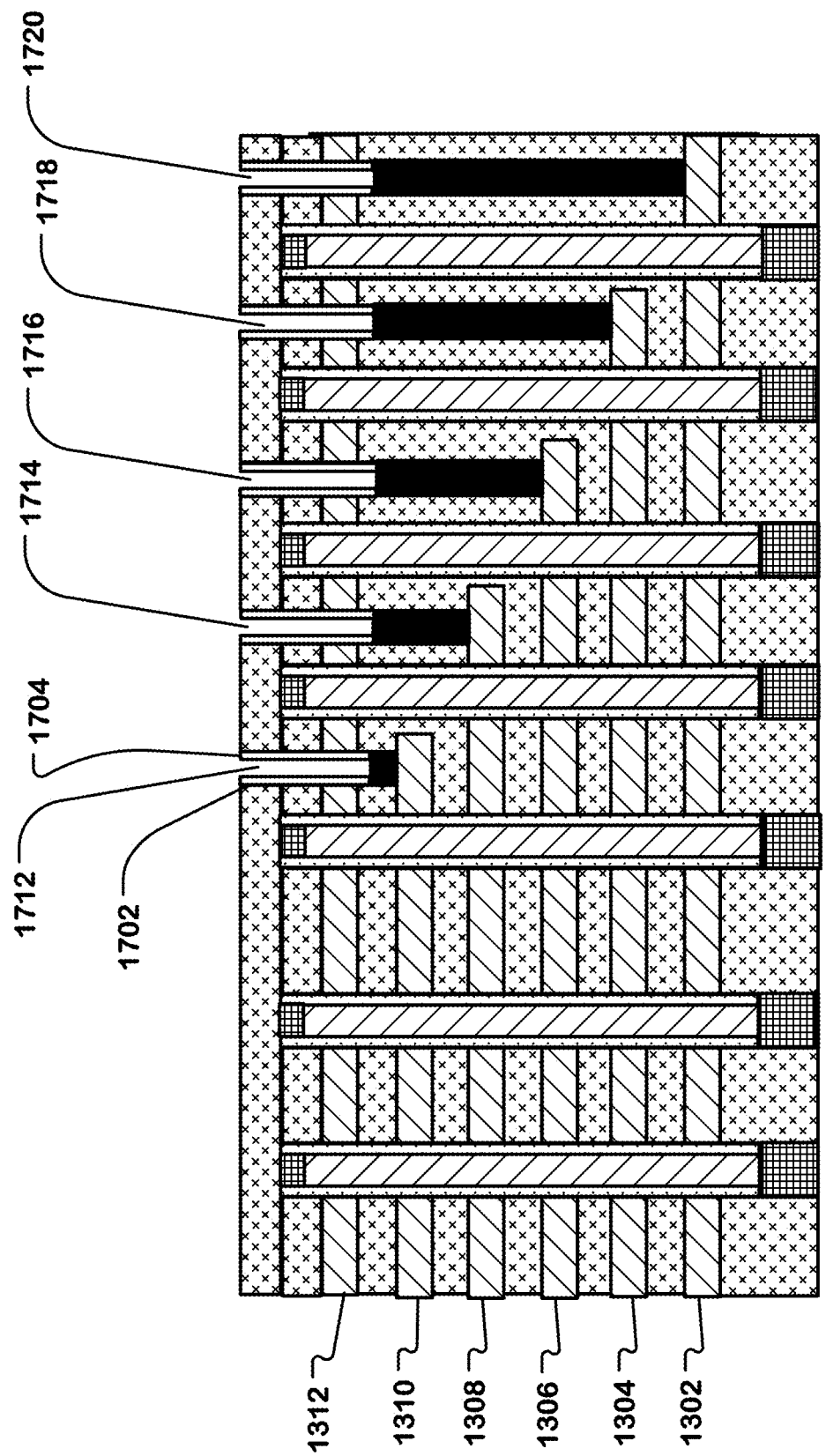

FIG. 17 illustrates a stage in the process flow after performing a step to form gate dielectric layers 1702, 1704 on the sidewalls of the sacrificial strips in the upper level 1312. In some embodiments, the gate dielectric layers 1702, 1704 may comprise a dielectric material such as silicon oxide. In other embodiments, the gate dielectric layers 1702, 1704 may comprise a dielectric material with a higher dielectric constant than silicon oxide. The gate dielectric layers 1702, 1704 may be formed by depositing a dielectric material inside the second openings 1612, 1614, 1616, 1618 and 1620. The dielectric material is then etched to form the gate dielectric layers 1702, 1704 and third openings 1712, 1714, 1716, 1718, 1720 self-aligned within the vias. The gate dielectric layers 1702 act as the gate oxide for the switches in the linking elements.

Figure 18:
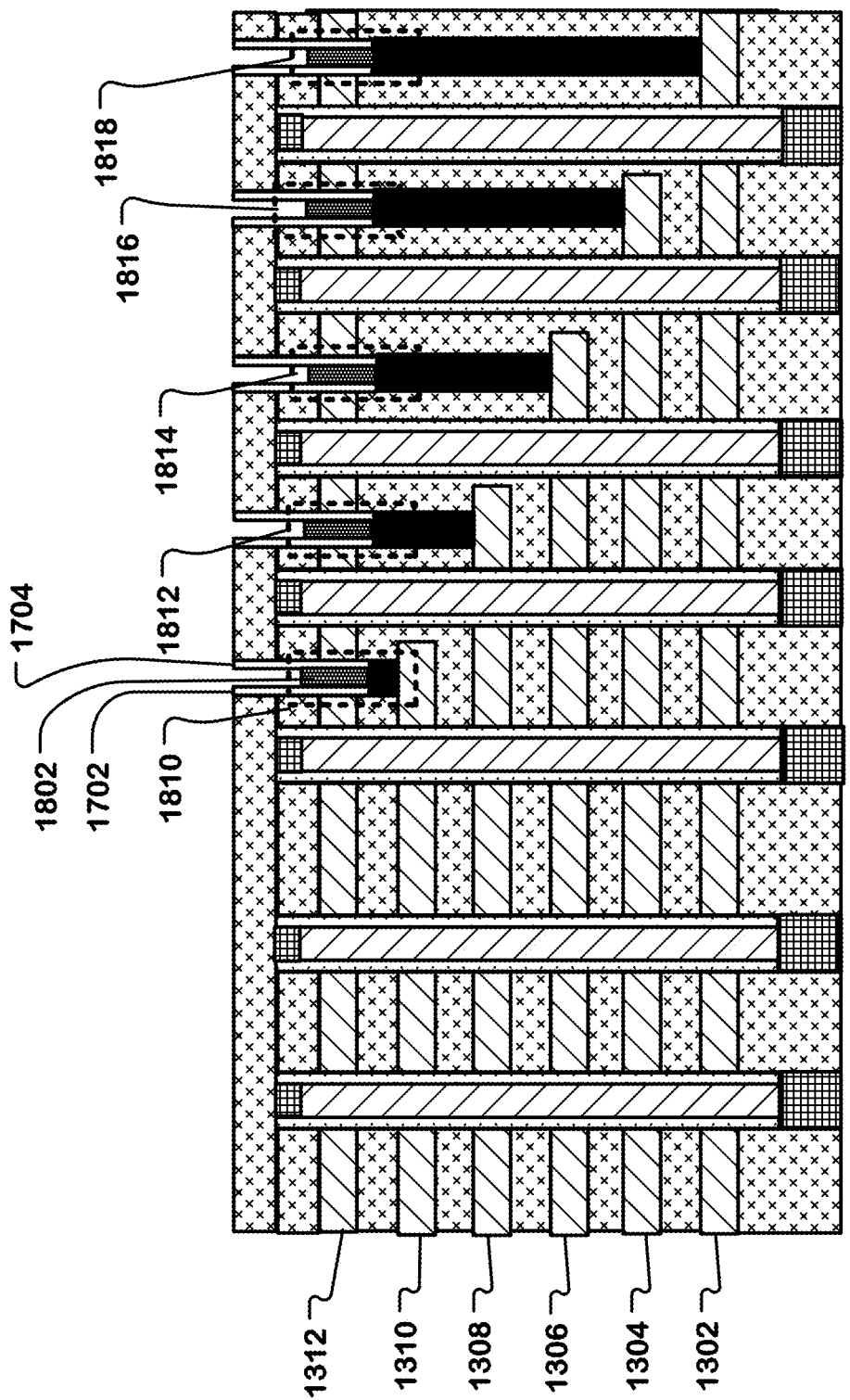

FIG. 18 illustrates a stage in the process flow after performing a step to fill the third openings with a semiconductor material to form vertical channels 1802. The vertical channel 1802 and gate dielectric layers 1702, 1704 form vertical channel transistors acting as switches 1810, 1812, 1814, 1816, and 1818 disposed vertically in contact with the first conductors in the second openings. The semiconductor material may comprise materials adapted to act as channels, such materials as Si, Ge, SiGe, GaAs, and SiC. The semiconductor material may be undoped or lightly P-type doped material. The top portion of the semiconductor material might be N+-type doped by ion implantation. The vertical channel transistors act as the switches in the 3D memory device, responsive to signals in the string select line in the upper level of conductive strips.

Figure 19:
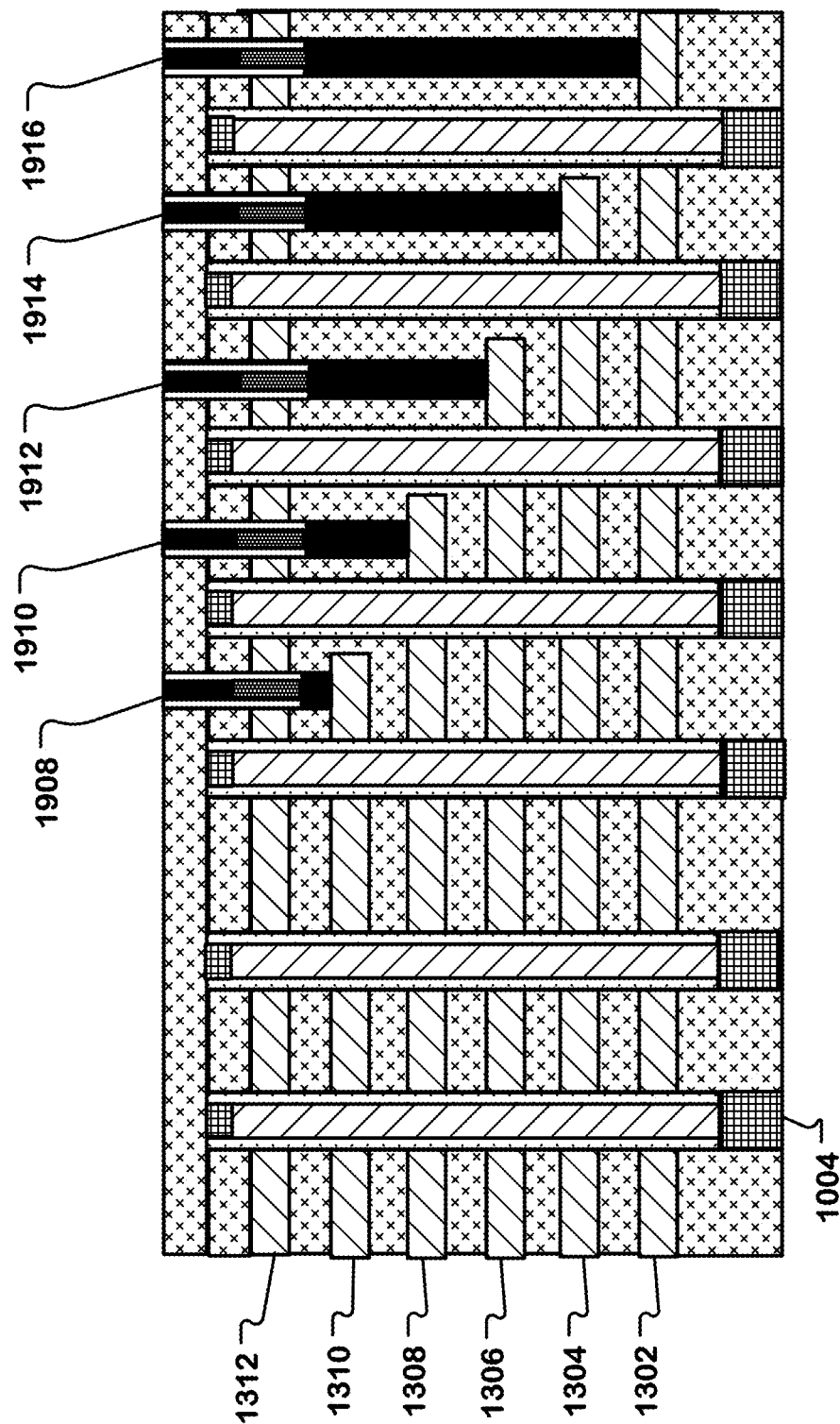

FIG. 19 illustrates a stage of the process after filling the plurality of third openings with the second conducting material to form second conductors 1908, 1910, 1912, 1914 and 1916. The top portion of the switches 1810, 1812, 1814, 1816, and 1818 that may be N+ doped form ohmic contacts with the second conductors 1908, 1910, 1912, 1914 and 1916. In other embodiments, the second conductors 1908, 1910, 1912, 1914 and 1916 can use different material from the first conductors 1602, 1604, 1606, 1608 and 1610.

Figure 20:
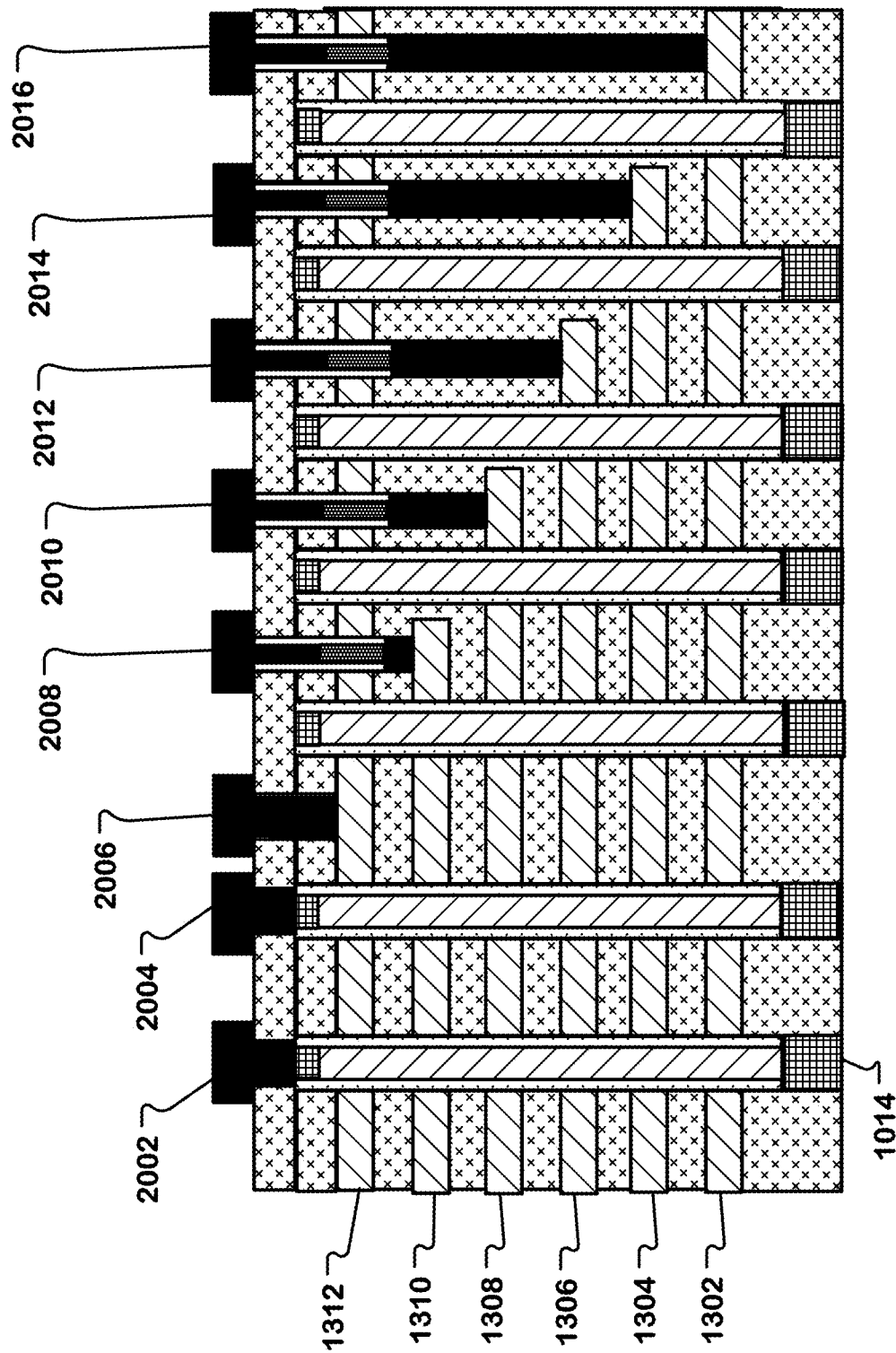

FIG. 20 illustrates a stage of the process after forming a plurality of first patterned conductors 2008, 2010, 2012, 2014, 2016 over the second conductors of the linking elements. An array of contact plugs 2002, 2004, 2006, which can be metal contact plugs, including tungsten plugs, are then formed along with the first patterned conductor layer including conductor lines connected to the SSL sides of the NAND strings and a second patterned conductor layer including bit lines connected to the SSL sides of the NAND strings (operated as bit lines).

The structure in FIG. 20 may be further processed to form 3D memory devices as illustrated by FIGS. 11-18 in U.S. Pat. No. 9,524,980, which is incorporated by reference as if fully set forth herein. The openings between stacks are filled on the inside surfaces of the channel structure with an insulating material such as silicon dioxide. In one embodiment, an air gap may be left at least in regions adjacent the intermediate layers of conductive strips. After the filling step, pillars may be etched between the stacks to form a plurality of vertical channel structures in a honeycomb arrangement, so that each row of vertical channel structures is offset in the row direction from adjacent rows. This honeycomb arrangement facilitates the formation of overlying bit lines with a tighter pitch. The structure is then etched to form arrays of first stacks and second stacks, connected by vertical channel structures. The upper channel pads of the vertical channel structures provide thicker landing areas for interlayer connectors for connection to a common source line and the bit line.

Figure 21:
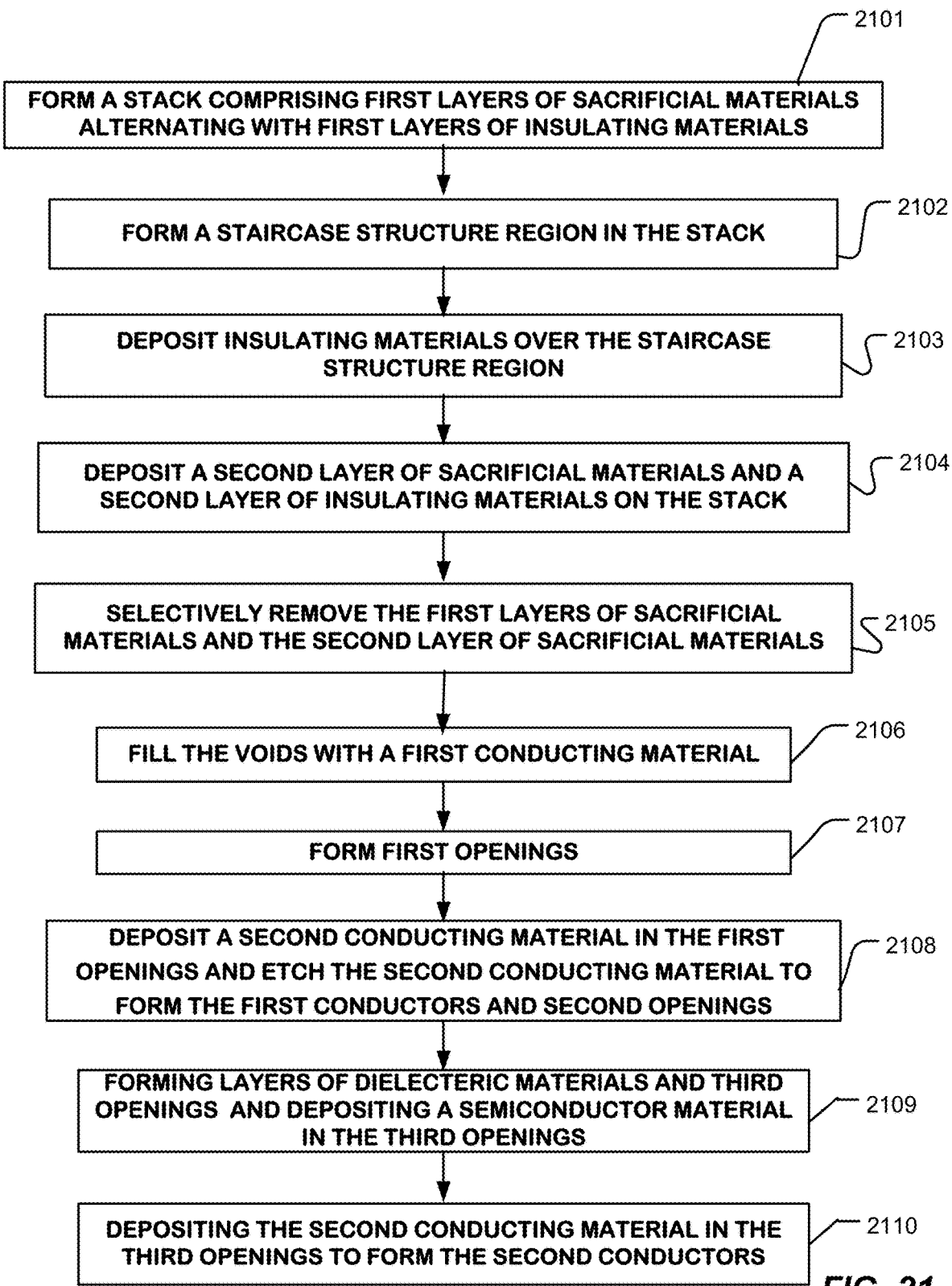
FIG. 21 is a flowchart illustrating a method for manufacturing a 3D memory device including linking elements with switches as described herein.

FIG. 21 is a flowchart illustrating a method for manufacturing a 3D memory including linking elements with switches responsive to signals in SSLs. The method includes forming a stack (e.g., 600 in FIG. 6) comprising a plurality of first layers of a sacrificial material separated by first layers of insulating material (step 2101), and forming a staircase structure region (e.g., 702 in FIG. 7) in the stack (step 2102). The staircase structure region comprises landing areas (e.g., 704, 706, 708, and 710 in FIG. 7) in the first layers of sacrificial materials. The method includes depositing insulating materials (e.g., 810 in FIG. 8) over the staircase structure region in the stack (step 2103). A second layer of sacrificial materials (e.g., 912 in FIG. 9) and a second layer of insulating materials (e.g., 914 in FIG. 9) are deposited over the stack (step 2104). A plurality of vertical channel structures (e.g., FIG. 11) is then formed in the stack. The first layers of sacrificial materials and the second layer of sacrificial materials are selectively removed to form voids (e.g., 1202, 1204, 1206, 1208, 1210, 1212 in FIG. 12) between the first layers of insulating materials and the second layer of insulating materials (step 2105). The voids created from removing the first layers of sacrificial materials are filled with a first conductive material to form a plurality of intermediate levels of conductive strips (e.g., 1302, 1304, 1306, 1308, and 1310 in FIG. 13) configured as word lines and ground select lines. The voids created from removing the second layer of sacrificial materials are filled with the first conductive material to form an upper level of conductive strips (e.g., 1312 in FIG. 13) configured as string select lines (step 2106).

The linking elements are formed by forming first openings (e.g., 1402, 1404, 1406, 1408, 1410 in FIG. 14) through a plurality of stacks of conductive strips in the staircase structure region (step 2106), depositing a second conducting material (e.g., 1502, 1504, 1506, 1508, 1510 in FIG. 15) in the first openings (step 2107), and etching the second conducting material to form the first conductors (e.g., 1602, 1604, 1606, 1608, 1610 in FIG. 16) of the linking elements and second openings (e.g., 1612, 1614, 1616, 1618, 1620 in FIG. 16) (step 2108). The second openings extend below the conductive strips in the upper level of conductive strips. Switches (e.g., 1812, 1812, 1814, 1816, 1818 in FIG. 17) for the linking elements are formed by depositing a dielectric material in the second openings and etching the dielectric material to form third openings and layers of dielectric material (e.g., 1702, 1704 in FIG. 17) next to sidewalls of the conductive strips in the upper level of conductive strips and depositing a semiconductor material in the third openings (step 2109). The second conducting material is then deposited in the third openings to form the second conductors (e.g., 1908, 1910, 1912, 1914, and 1916 in FIG. 19) (step 2110). A plurality of first patterned conductors (e.g., 2008, 2010, 2012, 2014, and 2016 in FIG. 20) is formed over the second conductors.

Figure 22:
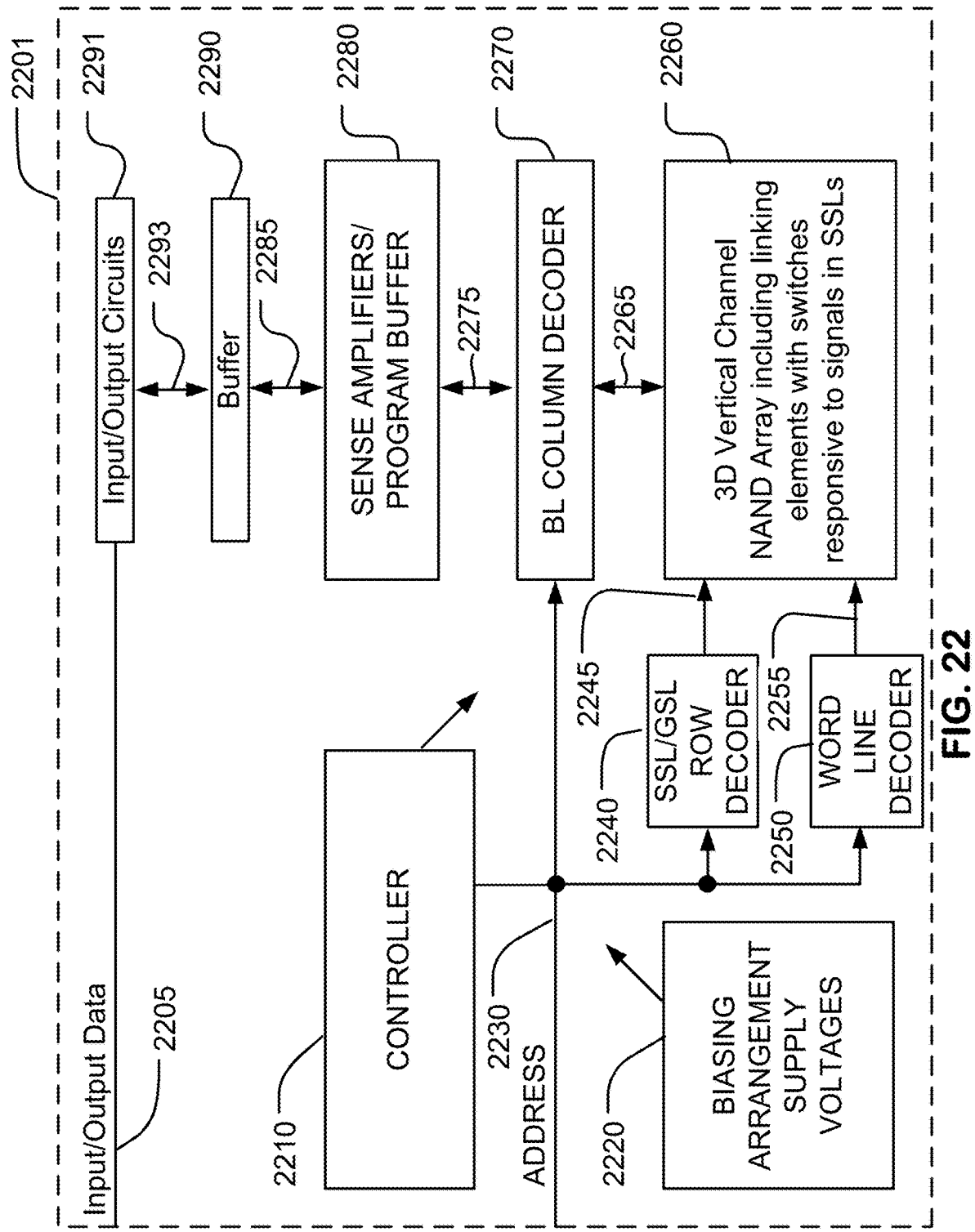
FIG. 22 is a block diagram of an integrated circuit memory including a 3D memory device having linking elements including switches.

FIG. 22 is a simplified chip block diagram of an integrated circuit 2201 including a 3D NAND memory including linking elements with switches responsive to signals in SSLs. The integrated circuit 2201 includes a memory array 2260 including one or more memory blocks as described herein including a linking element with switches on an integrated circuit substrate.

An SSL/GSL decoder 2240 is coupled to a plurality of SSL/GSL lines 2245, arranged in the memory array 2260. A word line decoder 2250 is coupled to a plurality of first/second word lines 2255. A bit line column decoder 2270 is coupled to a plurality of bit lines 2265 arranged along columns in the memory array 2260 for reading data from and writing data to the memory array 2260. Addresses are supplied on bus 2230 from control logic 2210 to decoder 2270, decoder 2240 and decoder 2250. Sense amplifier and program buffer circuits 2280 are coupled to the column decoder 2270, in this example via first data lines 2275. The program buffer in circuits 2280 can store program data to indicate program or inhibit states for selected bit lines. The column decoder 2270 can include circuits for selectively applying program and inhibit voltages to bit lines in the memory in response to the data values in the program buffer.

Sensed data from the sense amplifier/program buffer circuits are supplied via second data lines 2285 to the data buffer 2290, which is in turn coupled to input/output circuits 2291 via a data path 2293. Also, input data is applied in this example to the buffer 2290 for use in support of multiple-level program operations for each of the independent sides of the independent double gate cells in the array.

Input/output circuits 2291 drive the data to destinations external to the integrated circuit 2201. Input/output data and control signals are moved via data bus 2205 between the input/output circuits 2291, the control logic 2210 and input/output ports on the integrated circuit 2201 or other data sources internal or external to the integrated circuit 2201, such as a general purpose processor or special purpose application circuitry, or a combination of modules providing system-on-a-chip functionality supported by the memory array 2260.

In the example shown in FIG. 22, control logic 2210, using a bias arrangement state machine, controls the application of supply voltages generated or provided through the voltage supply or supplies in block 2220, such as read, erase, verify and program bias voltages. The control logic 2210 is coupled to the multi-level data buffer 2290 and the memory array 2260. The control logic 2210 includes logic to control multiple-level program operations. In embodiments supporting the vertical NAND structures described herein, the logic is configured to perform the method of: (i) selecting a layer of memory cells in the array, such as using a word line layer decoder; (ii) selecting vertical channel structures in a selected row in the array such as by using SSL switches, linking element switches and GSL switches on the rows of vertical channel structures; and (iii) storing charge in charge trapping sites in the selected layer on the selected side of vertical channel structures in one or more selected columns in the array, to represent data using bit line circuitry like page buffers on bit lines coupled to the selected row of vertical channel structures.

In some embodiments, the logic is configured to store multiple levels of charge to represent more than one bit of data in the charge trapping sites in the selected layer on the selected side. In this manner, a selected cell in a selected frustum of a vertical channel structure in the array stores more than two bits, including more than one bit on each side of the cell. Also, single-bit-per-cell embodiments can include the structures described herein.

The control logic 2210 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
   a plurality of stacks of conductive strips including a plurality of intermediate levels of conductive strips configured as word lines and an upper level of conductive strips configured as string select lines;
   a plurality of first patterned conductors above the plurality of stacks of conductive strips; and
   a plurality of linking elements, linking elements in the plurality of linking elements including switches responsive to signals in conductive strips in the upper level of conductive strips and connecting conductive strips in respective intermediate levels in the plurality of intermediate levels of conductive strips to first patterned conductors in the plurality of first patterned conductors.

2. The memory device of claim 1, wherein switches in the plurality of linking elements are vertical channel transistors.

3. The memory device of claim 2, wherein the vertical channel transistors have N-doped channels.

4. The memory device of claim 1, wherein the conductive strips in the upper level of conductive strips intersect switches in the plurality of linking elements.

5. The memory device of claim 1, wherein conductive strips in respective intermediate levels in the plurality of intermediate levels of conductive strips provide landing areas in a staircase structure region of the memory device.

6. The memory device of claim 5, linking elements in the plurality of linking elements further including first conductors below the switches, and second conductors above the switches, the first conductors connecting the landings areas in the staircase structure region to the switches, and the second conductors connecting the switches to the first patterned conductors.

7. The memory device of claim 1, wherein the plurality of stacks of conductive strips further includes a bottom level of conductive strips configured as ground select lines, and wherein linking elements in the plurality of linking elements connect conductive strips in the bottom level of conductive strips to second patterned conductors above the plurality of stacks of conductive strips.

8. The memory device of claim 1, further comprising:
   a plurality of vertical channel structures arranged orthogonally to the plurality of stacks of conductive strips, each of the vertical channel structures comprising a plurality of memory elements located at interface regions at cross-points between side surfaces of the plurality of stacks and the plurality of vertical channel structures; and
   a plurality of bit line conductors in a layer above the upper level of conductive strips, each of the vertical channel structures underlying one of the bit line conductors,
   wherein each conductive strip in the upper level of conductive strips intersects a respective distinct subset of vertical channel structures in the plurality of vertical channel structures.

9. The memory device of claim 1, wherein the first patterned conductors are coupled to a word line decoder.

10. A method of manufacturing a memory device, comprising:
    forming a plurality of stacks of conductive strips including a plurality of intermediate levels of conductive strips configured as word lines and an upper level of conductive strips configured as string select lines; and
    forming a plurality of first patterned conductors above the plurality of stacks of conductive strips; and
    forming a plurality of linking elements, linking elements in the plurality of linking elements connecting conductive strips in respective intermediate levels in the plurality of intermediate levels of conductive strips to first patterned conductors in the plurality of first patterned conductors and including switches responsive to signals in the conductive strips in the upper level of conductive strips.

11. The method of claim 10, wherein forming the switches comprises forming vertical channel transistors.

12. The method of claim 11, wherein forming the vertical channel transistors comprises forming N-doped channels.

13. The method of claim 10, wherein the conductive strips in the upper level of conductive strips intersect the switches in the plurality of linking elements.

14. The method of claim 10, wherein forming conductive strips in respective intermediate levels in the plurality of intermediate levels of conductive strips comprises forming landing areas in a staircase structure region of the memory device.

15. The method of claim 10, wherein forming the plurality of stacks of conductive strips including the plurality of intermediate levels of conductive strips and the upper level of conductive strips, comprises:
    forming a stack comprising first layers of sacrificial materials alternating with first layers of insulating materials;
    forming a staircase structure region in the stack, the staircase structure region comprising landing areas in the first layers of sacrificial materials;
    depositing insulating materials over the staircase structure region in the stack;
    depositing a second layer of sacrificial materials and a second layer of insulating materials on the stack;
    selectively removing the first layers of sacrificial materials and the second layer of sacrificial materials in the stack to form voids between the first layers of insulating materials and the second layer of insulating materials;

filling the voids from removing the first layers of sacrificial materials with a first conductive material to form the plurality of intermediate levels of conductive strips; and filling the voids from removing the second layer of sacrificial materials with the first conductive material to form the upper level of conductive strips.

16. The method of claim 15, wherein forming the plurality of linking elements comprises forming first conductors below the switches and second conductors above the switches, the first conductors connecting the landings areas in the staircase structure region to the switches and the second conductors connecting the switches to the first patterned conductors.

17. The method of claim 16, wherein forming the plurality of linking elements comprises:

forming first openings through the plurality of stacks of conductive strips in the staircase structure region, the first openings extending to the landing areas in the staircase structure region;

depositing a second conducting material in the first openings;

etching the second conducting material to form the first conductors and second openings, the second openings extending below conductive strips in the upper level of conductive strips;

depositing a dielectric material in the second openings;

etching the dielectric material to form third openings and layers of dielectric material next to sidewalls of the conductive strips in the upper level of conductive strips;

depositing a semiconductor material in the third openings; and depositing the second conducting material in the third openings to form the second conductors.

18. The method of claim 10, further comprising:

forming a plurality of vertical channel structures arranged orthogonally to the plurality of stacks of conductive strips, each of the vertical channel structures comprising a plurality of memory elements located at interface regions at cross-points between side surfaces of the plurality of stacks and the plurality of vertical channel structures; and forming a plurality of bit line conductors in a layer above the upper level of conductive strips, each of the vertical channel structures underlying one of the bit line conductors, wherein each of the conductive strips in the upper level of conductive strips intersects a respective distinct subset of vertical channel structures in the plurality of vertical channel structures.

19. A method of manufacturing a memory device, comprising:

forming a stack comprising first layers of sacrificial materials alternating with first layers of insulating materials;

forming a staircase structure region in the stack, the staircase structure region comprising landing areas in the first layers of sacrificial materials;

depositing insulating materials over the staircase structure region in the stack;

depositing a second layer of sacrificial materials and a second layer of insulating materials on the stack;

selectively removing the first layers of sacrificial materials and the second layer of sacrificial materials in the stack to form voids between the first layers of insulating materials and the second layer of insulating materials;

filling the voids by removing the first layers of sacrificial materials with a first conductive material to form a plurality of intermediate levels of conductive strips configured as word lines;

filling the voids by removing the second layer of sacrificial materials with the first conductive material to form an upper level of conductive strips configured as string select lines; and forming a plurality of linking elements, linking elements in the plurality of linking elements connecting conductive strips in respective intermediate levels in the plurality of intermediate levels of conductive strips to first patterned conductors in a plurality of first patterned conductors above the upper level of conductive strips and including switches responsive to signals in the conductive strips in the upper level of conductive strips, first conductors below the switches and second conductors above the switches, the first conductors connecting the landings areas in the staircase structure region to the switches and the second conductors connecting the switches to the first patterned conductors.

20. The method of claim 19, wherein forming the plurality of linking elements comprises:

forming first openings through the plurality of intermediate levels of conductive strips and the upper level of conductive strips in the staircase structure region, the first openings extending to the landing areas the staircase structure region;

depositing a second conducting material in the first openings;

etching the second conducting material to form the first conductors and second openings, the second openings extending below the conductive strips in the upper level of conductive strips;

depositing a dielectric material in the second openings;

etching the dielectric material to form third openings and layers of dielectric material next to sidewalls of the conductive strips in the upper level of conductive strips;

depositing a semiconductor material in the third openings; and depositing the second conducting material in the third openings to form the second conductors.

* * * * *